(12) United States Patent
Oooka et al.

(10) Patent No.: US 9,640,600 B2
(45) Date of Patent: May 2, 2017

(54) MANUFACTURING METHOD OF DISPLAY DEVICE, DISPLAY DEVICE, AND DISPLAY DEVICE FORMATION SUBSTRATE

(71) Applicant: Japan Display Inc., Minato-ku, Tokyo (JP)

(72) Inventors: Hiroshi Oooka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 141 days.

(21) Appl. No.: 14/639,766

(22) Filed: Mar. 5, 2015

(65) Prior Publication Data

US 2015/0255527 A1    Sep. 10, 2015

(30) Foreign Application Priority Data

Mar. 6, 2014    (JP) .................. 2014-043727

(51) Int. Cl.
- *H01L 27/32* (2006.01)
- *G09G 3/00* (2006.01)
- *H01L 21/66* (2006.01)
- *H01L 27/12* (2006.01)
- *H01L 51/52* (2006.01)

(52) U.S. Cl.
CPC ......... *H01L 27/3276* (2013.01); *G09G 3/006* (2013.01); *H01L 22/20* (2013.01); *H01L 22/32* (2013.01); *H01L 27/1259* (2013.01); *H01L 22/14* (2013.01); *H01L 27/124* (2013.01); *H01L 51/524* (2013.01); *H01L 51/5253* (2013.01); *H01L 2227/323* (2013.01)

(58) Field of Classification Search
CPC .................................................. G09G 3/006
See application file for complete search history.

(56) References Cited

U.S. PATENT DOCUMENTS

| | | | | |
|---|---|---|---|---|
| 5,473,261 A | * | 12/1995 | Marumoto | ............. G09G 3/006 324/760.01 |
| 2004/0183985 A1 | | 9/2004 | Taguchi | |
| 2006/0244741 A1 | | 11/2006 | Kimura et al. | |

FOREIGN PATENT DOCUMENTS

| | | |
|---|---|---|
| JP | 2004-287059 A | 10/2004 |
| JP | 2006-162701 A | 6/2006 |
| JP | 2006-330711 A | 12/2006 |
| JP | 2010-102237 A | 5/2010 |

OTHER PUBLICATIONS

Korean Offce Action mailed on May 13, 2016 for the coresponding Koean Patent Application No. 10-2015-0025486 with partial English translation.

* cited by examiner

*Primary Examiner* — Fernando L Toledo
*Assistant Examiner* — Valerie N Newton
(74) *Attorney, Agent, or Firm* — Typha IP LLC

(57) ABSTRACT

A manufacturing method of a display device includes forming a pixel in a display area of a panel, forming a transistor circuit in a peripheral area of the panel, the peripheral area being located in the vicinity of the display area, forming a first pad in a part of the peripheral area, forming a second pad in a peripheral area of another panel adjacent to the part of the panel, the second pad being electrically connected to the transistor circuit, performing a driving inspection on the transistor circuit by use of the second pad, and separating the first pad and the second pad from each other after the driving inspection.

7 Claims, 24 Drawing Sheets

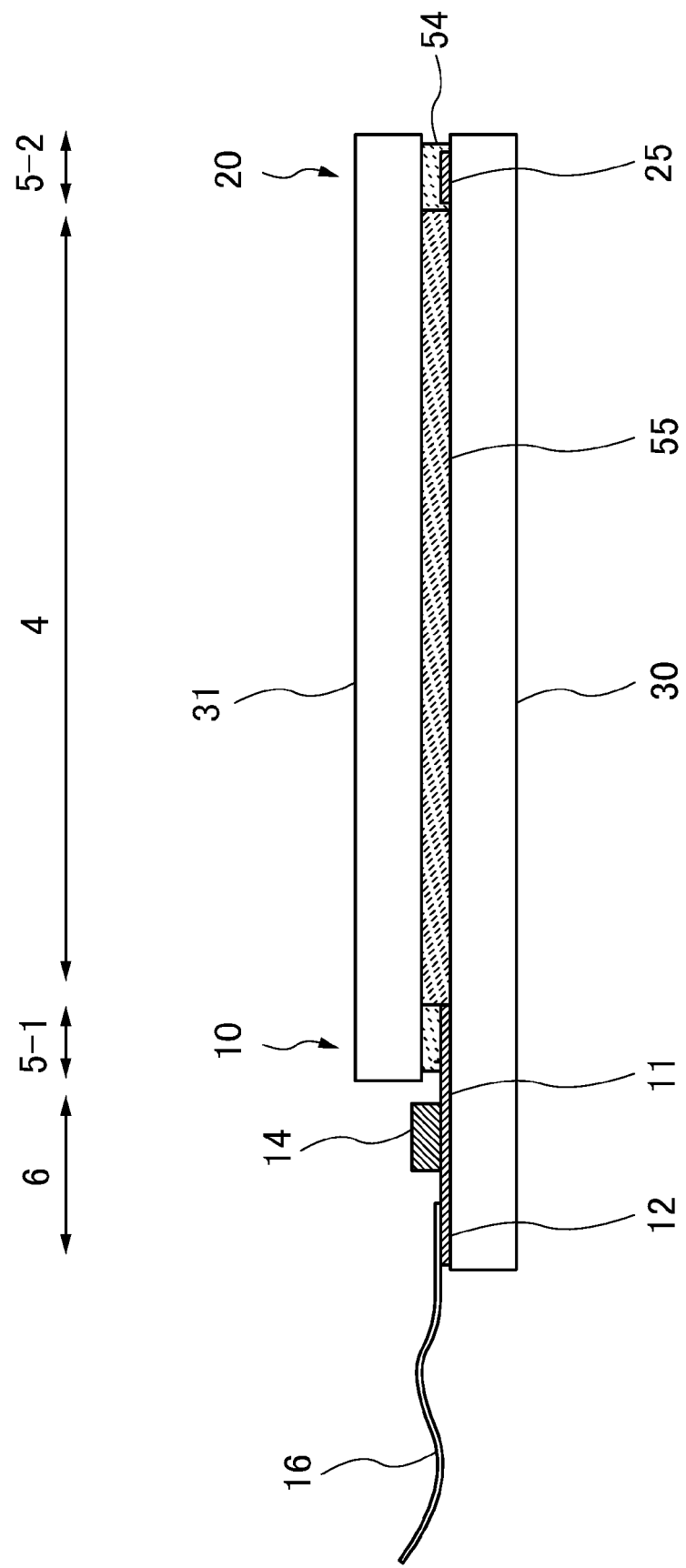

MANUFACTURING METHOD OF DISPLAY DEVICE, DISPLAY DEVICE, AND DISPLAY DEVICE FORMATION SUBSTRATE

CROSS-REFERENCE TO RELATED APPLICATIONS

This application is based upon and claims the benefit of priority from the prior Japanese Patent Application No. 2014-043727, filed on Mar. 6, 2014, the entire contents of which are incorporated herein by reference.

FIELD

The present invention relates to a manufacturing method of a display device, a display device, and a display device formation substrate, and specifically to a structure of a connection part of an external terminal and a connection terminal of the display device.

BACKGROUND

Recently, light-emitting display devices for uses in mobile devices are increasingly strongly desired to have higher definition and consume less power. Examples of display devices for uses in mobile devices are liquid crystal display devices (LCDs), display devices using elements for spontaneously emitting light, for example, organic light-emitting diode (OLED) display devices, electronic paper display devices, and the like.

Organic light-emitting diode display devices and electronic paper display devices do not require a backlight unit or a polarization plate, which is required in liquid crystal display devices. Therefore, the organic light-emitting display devices and the electronic paper display devices can be merely formed of thin films, and thus can be made flexible. In addition, such display devices do not use a glass substrate, and therefore are lightweight and are not easily breakable. For these reasons, organic light-emitting diode display devices attract a lot of attention. Especially, a compact organic light-emitting diode display device having high precision is now desired.

In a production process of a display device, a circuit for driving inspection (driving inspection circuit) located in the display device is inspected (tested). For the testing, a pad for testing (testing pad) that is located in a peripheral area of a display panel and is connected to the circuit via a line for testing (testing line) is supplied with an external signal by probing. For modularization of the panels formed on a substrate, the substrate and a counter substrate are bonded together via a sealing material. In addition, external elements such as LSI chips, FPCs and the like are mounted on a pad for an external terminal (external terminal pad) connected to a driving circuit of the panel via a line for an external terminal (external terminal line). In a conventional display device, as described in, for example, Japanese Laid-Open Patent Publication 2006-330711, the testing pad and the external terminal pad are located adjacent to each other.

In a display device obtained by reducing the size of the display device described in Japanese Laid-Open Patent Publication 2006-330711, the sizes of these pads are reduced and the distance between the pads is also shortened, which makes the layout difficult. In addition, in the case where, as in a flexible circuit board, a member easily deformable by an external pressure provided by probing or the like is located below the testing pad, the pad and also an area in the vicinity of the pad are deformed by probing. This also deforms the external terminal pad located adjacent to the testing pad, which adversely influences the mounting of the external elements during a step of modularization. In addition, since the distance between the pads is shortened, a highly precise positional alignment mechanism is required for probing performed for testing. Since a high alignment precision is required, the alignment needs a longer time and thus the productivity is decreased.

SUMMARY

A manufacturing method of a display device according to the present invention includes forming a pixel in a display area of a panel, forming a transistor circuit in a peripheral area of the panel, the peripheral area being located in the vicinity of the display area, forming a first pad in a part of the peripheral area, forming a second pad in a peripheral area of another panel adjacent to the part of the panel, the second pad being electrically connected to the transistor circuit, performing a driving inspection on the transistor circuit by use of the second pad, and separating the first pad and the second pad from each other after the driving inspection.

In another embodiment, the method may further include forming a sealing member covering the second pad in the another panel.

In still another embodiment, a plurality of the second pads may be formed, the plurality of second pads may be electrically connected to the transistor circuit via a plurality of second lines, and the first pad may be formed between any two of the plurality of second lines.

In still another embodiment, a plurality of the first pads and a plurality of the second pads may be formed, the plurality of second pads may be electrically connected to the transistor circuit via a plurality of second lines, and the plurality of second lines may be formed outer to the plurality of first pads.

In still another embodiment, the driving inspection may be performed by probing the second pad.

In still another embodiment, the second pad may be formed on a substrate containing a resin.

A display device according to the present invention includes a pixel provided in a display area of a panel, a transistor circuit provided in a peripheral area of the panel, the peripheral area being located in the vicinity of the display area, a first pad provided in a part of the peripheral area, and a second pad provided in another part of the peripheral area and covered with a sealing member, the another part facing the part while having the display area therebetween.

In another embodiment, the display device may further include a first line electrically connecting the first pad and the transistor circuit to each other. A part of the first line overlapping the sealing member and a part of the second pad overlapping the sealing member may have the same cross-sectional structure.

In still another embodiment, a plurality of the first lines and a plurality of the second pads may be provided, at least one of the first lines may be provided on each of two sides of a center of the part, and at least one of the second pads may be provided on each of two sides of a center of the another part.

A display device formation substrate including a plurality of panel regions according to the present invention includes a pixel provided in a display area of a first panel region as one of the plurality of panel regions, a transistor circuit provided in a peripheral area of the first panel region, the peripheral area being located in the vicinity of the display area, a first pad provided in a part of the peripheral area, and a second pad provided in a peripheral area of a second panel region, as another of the plurality of panel regions, adjacent to the part of the first panel region, the second pad being electrically connected to the transistor circuit of the first panel region.

In another embodiment, the display device formation substrate may further include a second line electrically connecting the second pad and the transistor circuit to each other. A plurality of the second pads and a plurality of the second lines may be provided, and the first pad may be located between any two of the plurality of second lines.

In still another embodiment, the display device formation substrate may further include a second line electrically connecting the second pad and the transistor circuit to each other. A plurality of the first pads may be provided, and the second line may be located outer to the plurality of first pads.

In still another embodiment, a substrate on which the second pad is provided may contain a resin.

BRIEF DESCRIPTION OF DRAWINGS

FIG. 8A is a cross-sectional view of a modularized panel of the display device in embodiment 1 according to the present invention;

DESCRIPTION OF EMBODIMENTS

Figure 1:
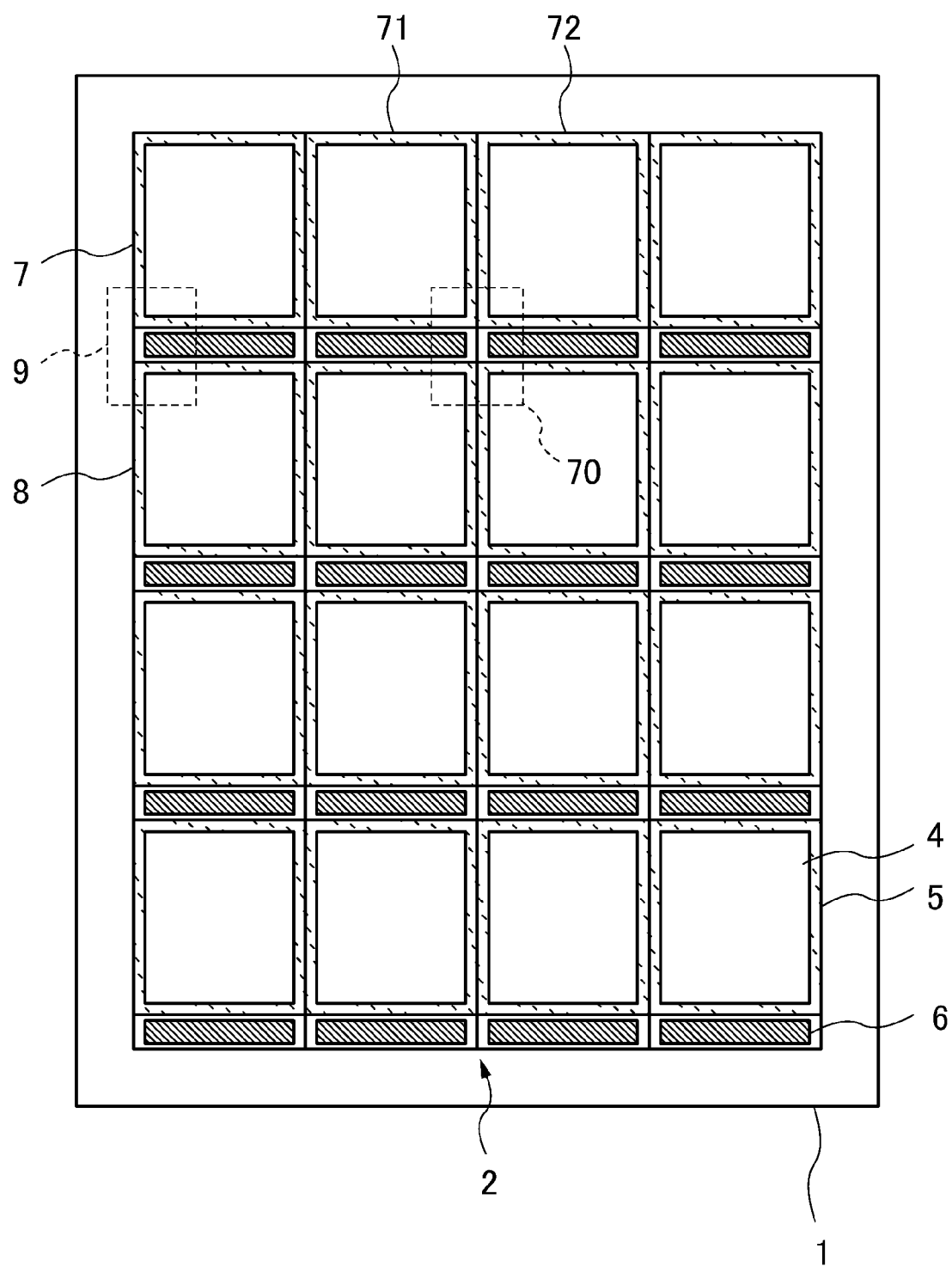
FIG. 1 shows a layout of display devices on a display device formation substrate in embodiment 1 according to the present invention.

Hereinafter, embodiments of the present invention will be described with reference to the drawings. The disclosure is merely exemplary, and alternations and modifications conceivable by a person of ordinary skill in the art without departing from the gist of the present invention are duly encompassed in the scope of the present invention. In the drawings, elements may be shown schematically regarding the width, thickness, shape and the like, instead of being shown in accordance with the actual sizes. The drawings are merely exemplary and do not limit the interpretations of the present invention in any way. In the specification and the drawings, elements that are substantially the same as those described before bear the identical reference signs thereto, and detailed descriptions thereof may be omitted.

<Embodiment 1>

With reference to FIG. 1 through FIG. 8B, a structure of a display device in embodiment 1 according to the present invention will be described. FIG. 1 shows a layout of display devices in a display device formation substrate in embodiment 1 according to the present invention.

As shown in FIG. 1, the display device formation substrate includes a substrate 1 and a panel region 2 including a plurality of panels provided in horizontal and vertical directions. The panel region 2 is located on the substrate 1. Each of the plurality of panels includes a display area 4 and a peripheral area 5 located in the vicinity of the display area 4. Along one side of the peripheral area 5, a terminal area 6 including a terminal connectable to an external element is provided. The terminal area 6 is a part of the peripheral area of the panel, but in the embodiments, the terminal area 6 is distinguished from the peripheral area 5 for the sake of clarity. The display area 4 may include pixels for displaying an image and a pixel circuit for allowing the pixels to emit light. The peripheral area 5 may include a driving circuit for controlling the pixel circuit and an inspection circuit for checking whether the corresponding panel is operable or not before modularization. The driving circuit and the inspection circuit each include a transistor and may be called a "transistor circuit".

Figure 2:
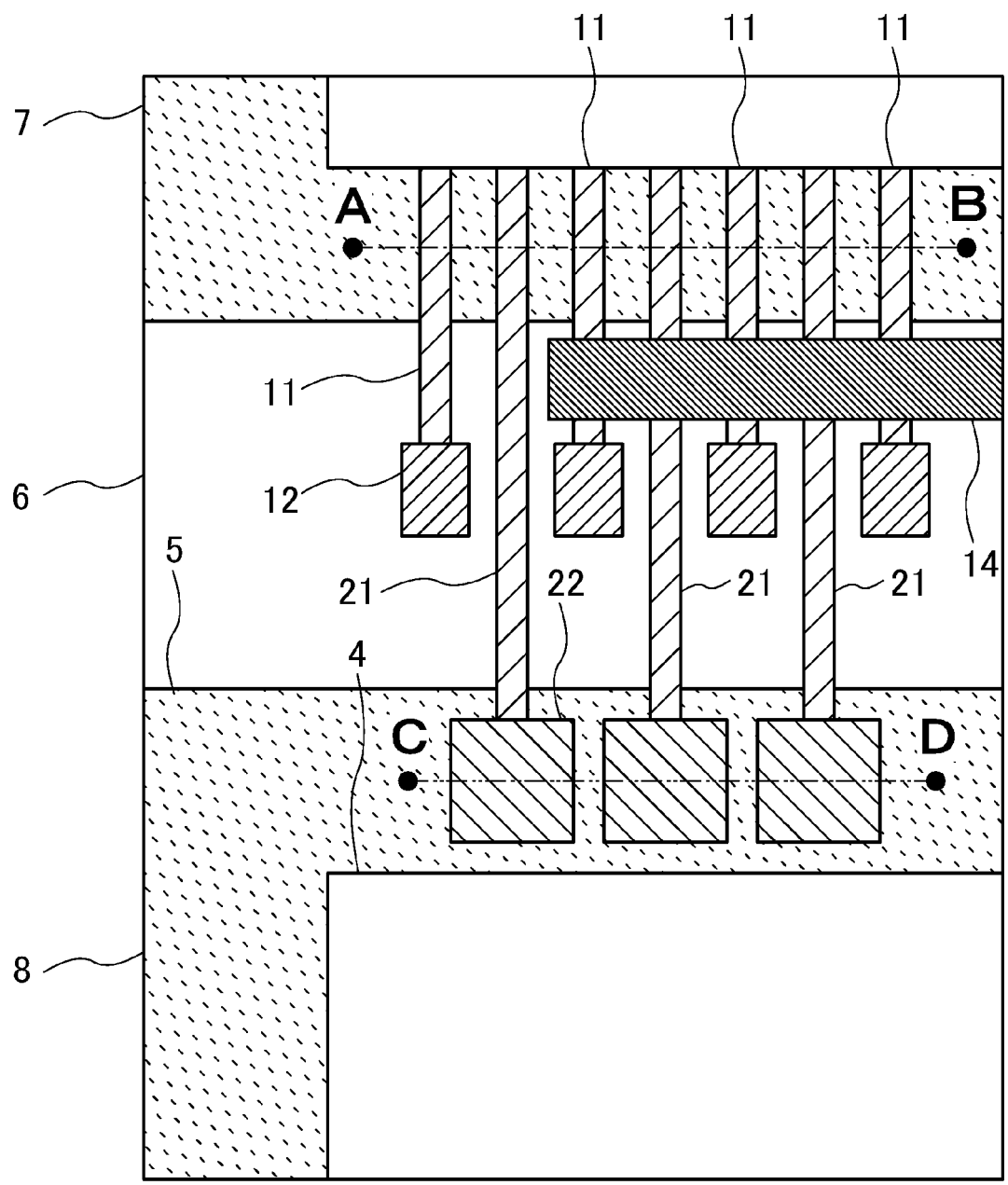
FIG. 2 is an enlarged view of an area between adjacent panels of the display devices in embodiment 1 according to the present invention.

FIG. 2 is an enlarged view of an area between adjacent panels of the display devices in embodiment 1 according to the present invention. More specifically, FIG. 2 shows an area 9 between a panel 7 and a panel 8 shown in FIG. 1.

In the terminal area 6 located along one side of the peripheral area 5 of the panel 7, external terminal lines 11 and testing lines 21 are located alternately. The external terminal lines 11 are electrically connected to a transistor circuit for driving the pixels in the panel 7. The external terminal lines 11 are also respectively connected to external terminal pads 12 located in the terminal area 6 of the panel 7. The testing lines 21 are electrically connected to a transistor circuit for driving inspection or the transistor circuit for driving the pixels. The testing lines 21 are also respectively connected to testing pads 22 located in one side of the peripheral area 5 of the panel 8, which is adjacent to the terminal area 6 of the panel 7. In FIG. 2, the testing lines 21 are located between each pair of adjacent external terminal pads 12 in the terminal area 6. The present invention is not limited to having such a structure, and the external terminal pads 12 may be located between any two of the plurality of testing lines 21. A part of the external lines 11 may be connected to a driver IC 14.

An area in which the testing pads 22 are located is included in a region on which a dam member (sealing member), for holding a filler that is used to seal a light-emitting layer, is to be located in a later step. Namely, the testing pads 22 of the panel 7 are to be covered with the dam member in the peripheral area 5 of the panel 8 in the later step. The dam member also acts as a sealing member for bonding the display device formation substrate including the transistors and a counter substrate to each other. In FIG. 2, the testing pads 22 are located to be completely covered with the dam member that is to be located in the peripheral area 5 of the panel 8. Alternatively, a part of the testing pads 22 may be located in the terminal area 6 of the panel 7.

As described above, the testing pads 22 of the panel 7 are provided in the peripheral area 5 of the panel 8 adjacent to the panel 7. This enlarges a usable space of the terminal area 6 of the panel 7, which raises the degree of freedom of layout. As a result, a highly precise and costly positional alignment mechanism is made unnecessary for probing performed for testing. Since such highly precise alignment is not necessary, the time required for the alignment is shortened, which advantageously raises the productivity. Since the area size of the terminal area 6 occupied by the pads is decreased, the size of each panel is reduced.

It is now assumed that a member easily deformable by an external pressure such as a resin member or the like is provided below the testing pads 22 as in, for example, a flexible circuit board or the like, and the pads 22 and an area in the vicinity thereof are deformed by probing performed for testing. Even in such a case, the above-described structure in which the testing pads 22 of the panel 7 are provided in the peripheral area 5 of the panel 8 suppresses the influence of the deformation on other external pads, lines and the like.

Figure 3:
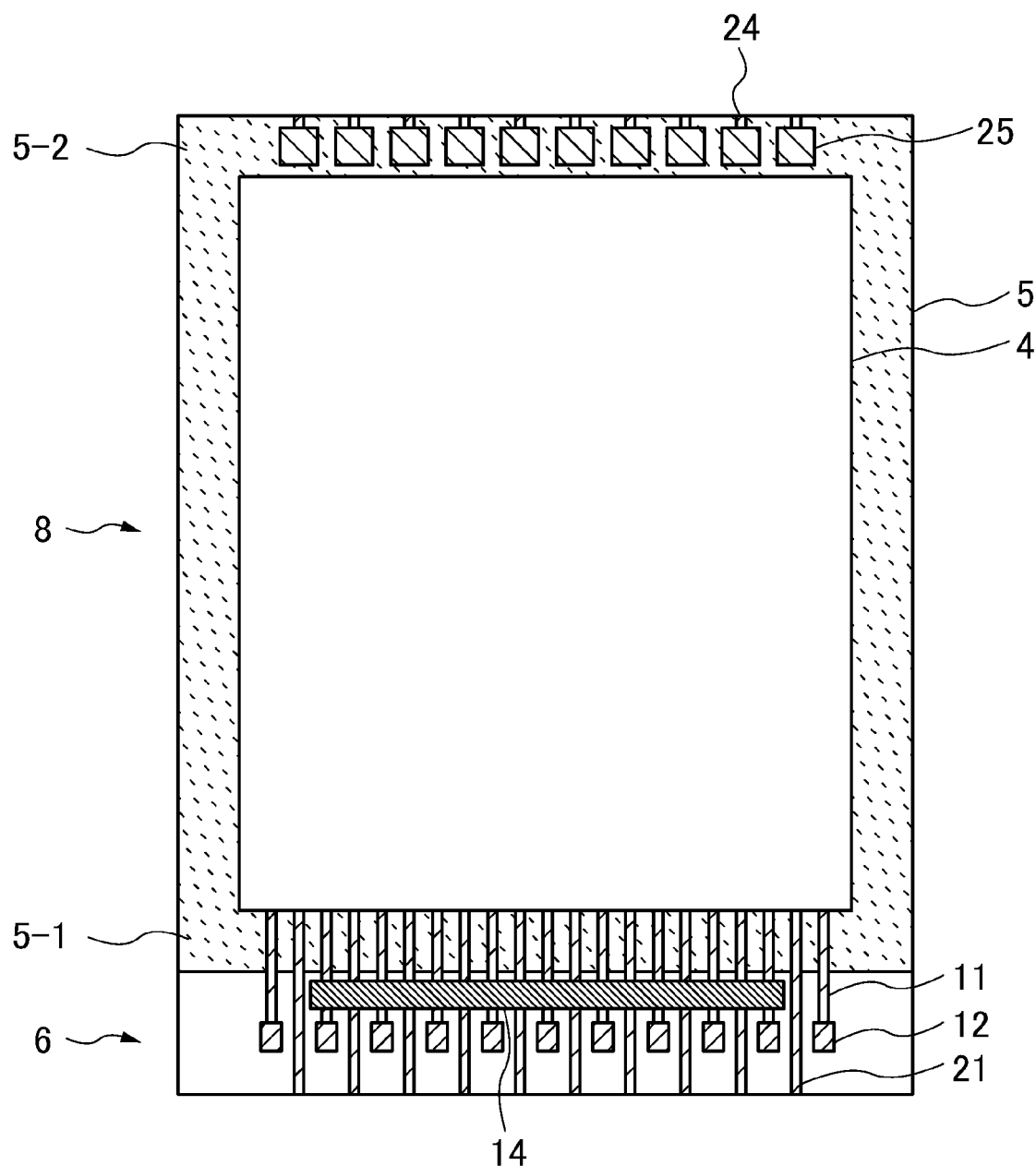
FIG. 3 is a plan view of one individual panel obtained by dividing the display device formation substrate in embodiment 1 according to the present invention.

After the light-emitting layer is formed, the display device formation substrate is divided into individual panels. Referring to FIG. 2, the display device formation substrate is divided along a line between the panel 7 and the panel 8. In more detail, the display device formation substrate is divided along a line between the external terminal pads 12 of the panel 7 and the testing pads 22 of the panel 7. As a result, the panel 7 and the panel 8 are separated from each other. FIG. 3 is a plan view of an individual panel obtained as a result of the division.

FIG. 3 is a plan view of one panel (herein, panel 8) of the display device in embodiment 1 according to the present invention obtained as a result of the division. As described above, the panels are separated from each other along a line between the external terminal pads and the testing pads (the panel 8 is separated from an adjacent panel along a line between the external terminal pads 12 and the testing pads 22 of the panel 8). As a result, as shown in FIG. 3, the testing lines 21 of the panel 8 are cut at an edge of the terminal area 6 of the panel 8. In the peripheral area 5 facing the terminal 6 with the display area 4 of the panel 8 being sandwiched therebetween (namely, in the peripheral area 5-2 of the panel 8), a part of testing lines 24 of the panel 7 and also testing pads 25 of the panel 7, which is adjacent to the panel 8 in the display device formation substrate, are located. The external terminal lines 11 may be provided such that at least one external terminal line 11 is located on each of two sides of a center of a peripheral area 5-1 in the horizontal direction. The testing pads 25 of the panel 7 may be provided such that at least one testing pad 25 of the panel 7 is located on each of two sides of a center of the peripheral area 5-2 in the horizontal direction.

Figure 4:
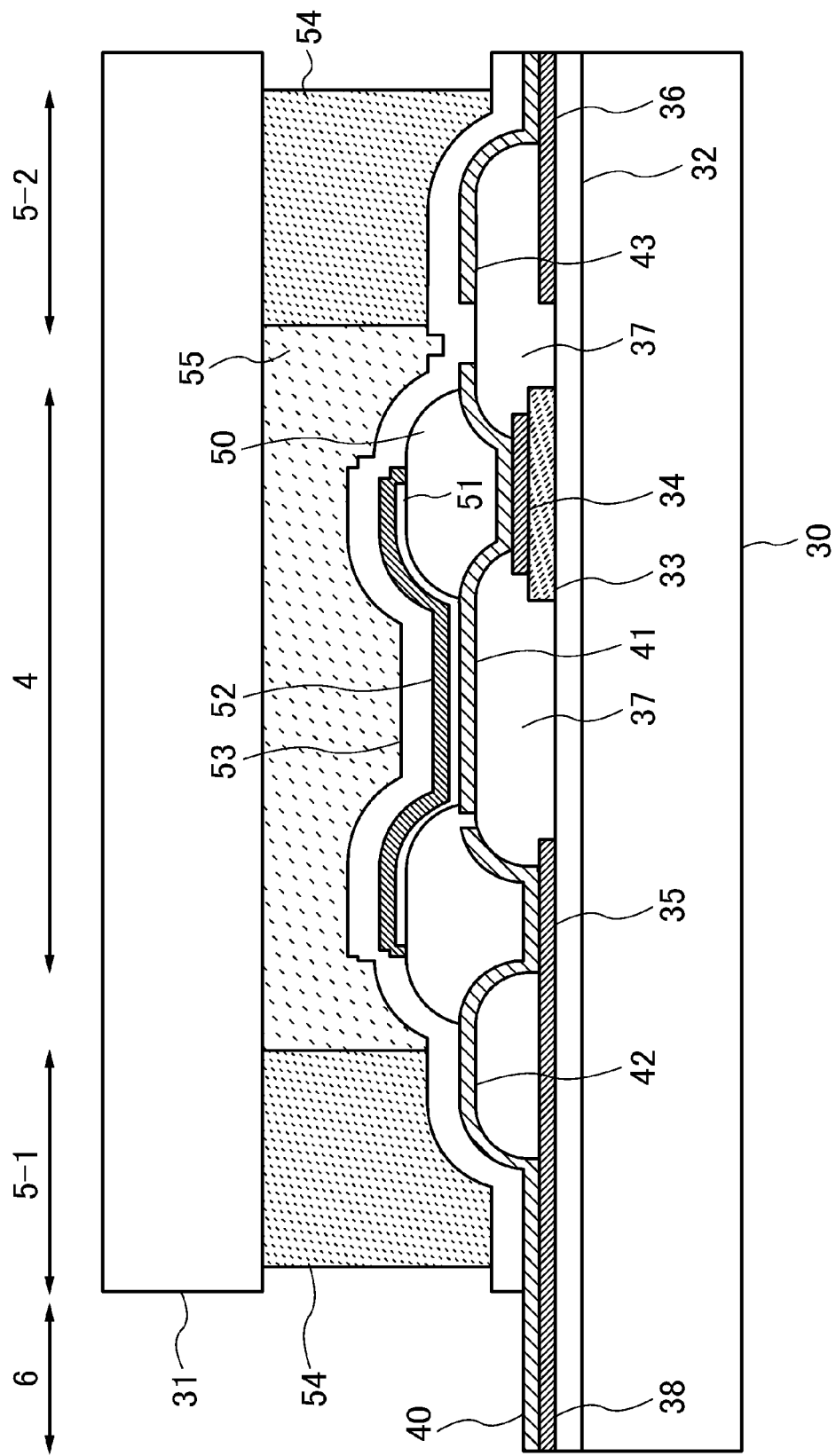
FIG. 4 is a cross-sectional view of peripheral areas and a display area of the panel in embodiment 1 according to the present invention.

FIG. 4 is a cross-sectional view of the peripheral areas 5-1 and 5-2, the display area 4 and the terminal area 6 of the panel 8 in embodiment 1 according to the present invention. FIG. 4 shows a cross-section of each of the display area 4, the terminal area 6, the peripheral area 5-1 along the terminal area 6, and the peripheral area 5-2 facing the terminal area 6 with the display area 4 being sandwiched therebetween. The display device in embodiment 1 includes a substrate 30 and an underlining layer 32 provided on the substrate 30. The display area 4 includes a transistor layer 33 including a transistor forming a driving circuit, a driving inspection circuit or the like, and a transistor line layer 34 acting as a source or drain electrode for supplying a voltage to the transistor. The transistor layer is not provided in the peripheral area 5-1 or 5-2. The peripheral area 5-1 and terminal area 6 include first line layers 35 and 38 and second line layers 40 and 42 corresponding to a part of the testing lines 21 and a part of the external terminal lines 11 and the external terminal pads 12, shown in FIG. 3. The peripheral area 5-2 includes a first line layer 36 corresponding to a part of the testing lines 24 and a second line layer 43 corresponding to the testing pads 25. The testing lines 24 and the testing pads 25 are of the panel 7 adjacent to the panel 8 in the display device formation substrate.

Between the transistor line layer 34 and the first line layer 35 and between the transistor line layer 34 and the first line layer 36, an interlayer insulating layer 37 is provided. In the display area 4, a pixel electrode 41 is provided on the interlayer insulating layer 37. The interlayer insulating layer 37 may be a flattening film for alleviating steps caused by the transistor layer 33, the transistor layer 34 and the first line layers 35 and 36. The first line layer 35 and the second line layer 42 located in the peripheral area 5-1 are respectively connected to the first line layer 38 and the second line layer 40 corresponding to the external terminal pads 12 located in the terminal area 6. In FIG. 4, in the peripheral areas 5-1 and 5-2, the first line layer 35 and the second line layer 42 are partially stacked on each other and also the first line layer 36 and the second line layer 43 are partially stacked on each other. The present invention is not limited to having such a structure. Either one of the first line layers and the second line layers may be provided. Alternatively, another layer may be included in each of the stacking structures.

On the pixel electrode 41 and the second line layers 42 and 43, a demarcation layer 50 for demarcating the pixels in the display area 4 is provided. The demarcation layer 50 is mainly located in the display area 4, and has an opening corresponding to a light-emitting area of the pixel. In the opening, a light-emitting layer 51 for emitting light by being supplied with an electric current and a common electrode 52 acting as a cathode of the light-emitting layer 51 are provided. A protective film 53 is provided to cover the common electrode 52 of the display area 4 and the second line layers 42 and 43 in the peripheral areas 5-1 and 5-2. The protective film 53 may be formed of a material having a high blocking capability against moisture and impurities. The protective film 53 may be formed of, for example, a silicon nitride film, a silicon oxide film, or a stack of a silicon nitride line and a silicon oxide line.

On the protective film 53, dam members 54 and a filler 55 are provided. On the dam members 54 and the filler 55, a counter substrate 31 is provided. In the peripheral areas 5-1 and 5-2, the part of the external terminal lines 11 and the part of the testing pads 25 below the dam members 54 may have the same cross-sectional structure. However, it is sufficient that the dam members 54 have substantially the same height in the peripheral areas 5-1 and 5-2, and the elements below the dam members 54 do not need to have the same layer structure. An end of the counter substrate 31 on the terminal area 6 side and an end of the protective film 53 on the terminal 6 side are substantially aligned to each other. In the terminal area 6 where the counter substrate 31 is not provided, the protective film 53 is not provided and the second line layer 40 is exposed.

Figure 5:
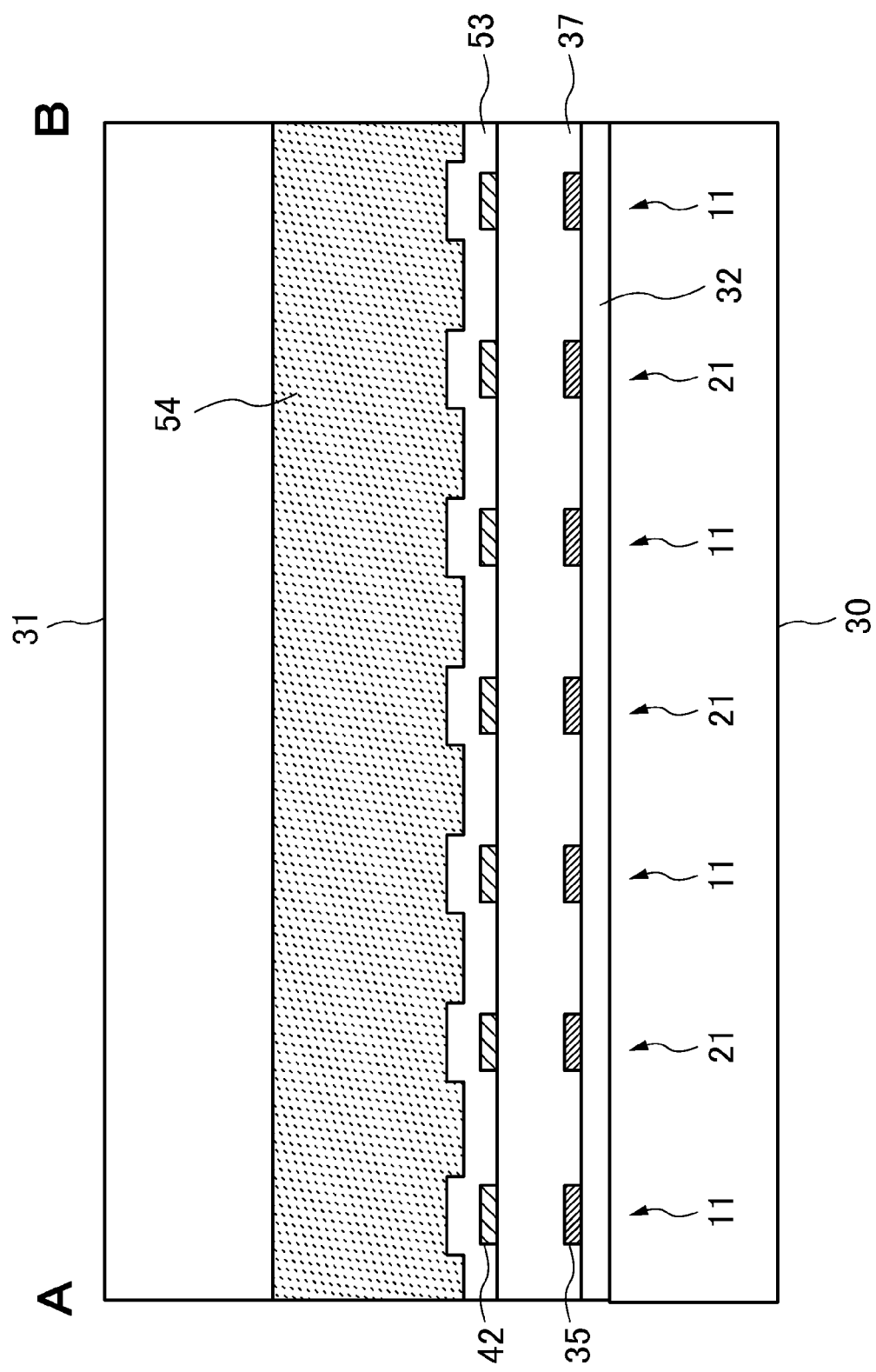
FIG. 5 is a cross-sectional view of lines of the display device in embodiment 1 according to the present invention, taken along line A-B in FIG. 2.

FIG. 5 is a cross-sectional view of the lines in the peripheral area 5 of the panel 7 taken along line A-B in FIG. 2. In FIG. 5, the protective film 53 reflects the pattern of the second line layer 42 located on the interlayer insulating layer 37 and thus has concaved and convexed portions. The second line layer 42 and the first line layer 35 correspond to the external terminal lines 11 and the testing lines 21. On the protective film 53 having the concaved and convexed portions, the dam member 54 is formed.

Figure 6:
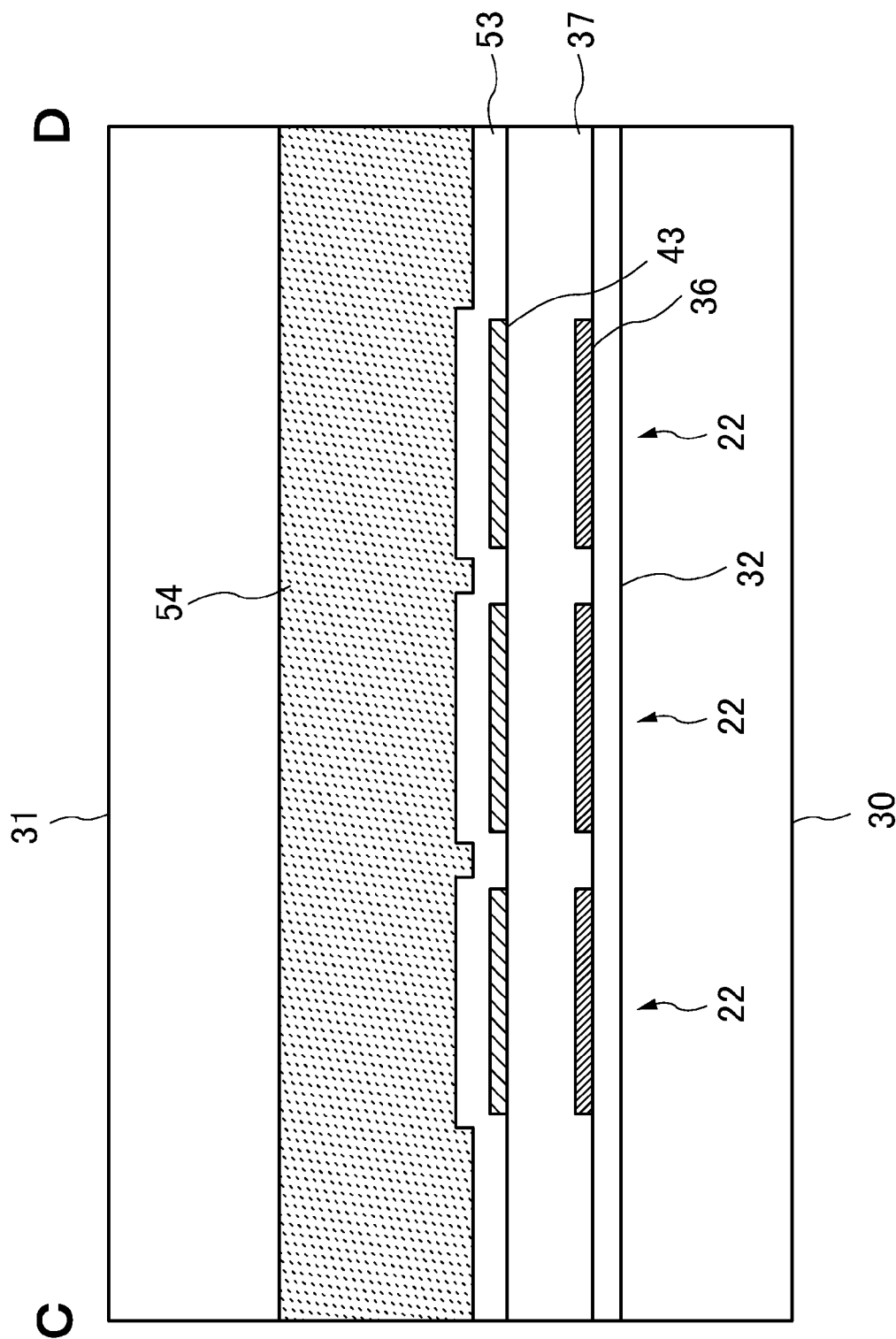
FIG. 6 is a cross-sectional view of pads of the display device in embodiment 1 according to the present invention, taken along line C-D in FIG. 2.

FIG. 6 is a cross-sectional view of the pads in the peripheral area 5 of the panel 8 taken along line C-D in FIG. 2. In FIG. 6, like in FIG. 5, the protective film 53 reflects the pattern of the second line layer 43 located on the interlayer insulating layer 37 and thus has concaved and convexed portions. The second line layer 43 corresponds the testing pads 22. On the protective film 53 having the concaved and convexed portions, the dam member 54 is formed.

As described above, the protective film 53 has the concaved and convexed portions in the peripheral area 5 of each panel, and the dam members 54 are provided on the protective film 53. This structure increases the size of a contact area of the protective film 53 and the dam members 54. As a result, the adhesiveness between the protective film 53 and the dam members 54 is raised. In a conventional planar structure, elements such as the testing lines 24 or the testing pads 25 shown in FIG. 3 are not provided in the peripheral area 5-2. By contrast, even in the conventional structure, the external terminal lines 11 and the testing lines 21 are located in the peripheral area 5-1. Namely, the conventional structure has a problem that the adhesiveness between the dam member and the elements below the dam member in the peripheral area 5-1 is different from the adhesiveness between the dam member and the elements below the dam member in the peripheral area 5-2. The layout as shown in FIG. 3 solves the above-described problem, and the adhesiveness between the dam member and the elements below the dam member is made equal in the two peripheral areas 5 facing each other while having the display area 4 therebetween.

In addition, referring to FIG. 4, the layer structure below the dam member 54 in the peripheral area 5-1 and the layer structure below the dam member 54 in the peripheral area 5-2 are the same as each other, or the dam members 54 in the peripheral area 5-1 and the peripheral area 5-2 have substantially the same height. Therefore, the distance between the light-emitting layer 51 and the counter substrate 31 is kept the same in each of the plurality of pixels located in the display area 4. This provides an effect of suppressing non-uniformity of interference. Even if the layer structures below the dam members 54 in the peripheral areas 5-1 and 5-2 are different from each other, the interlayer insulating layer 37 flattens the steps caused by the layers, so that the height of the dam members 54 can have substantially the same height.

Figure 7:
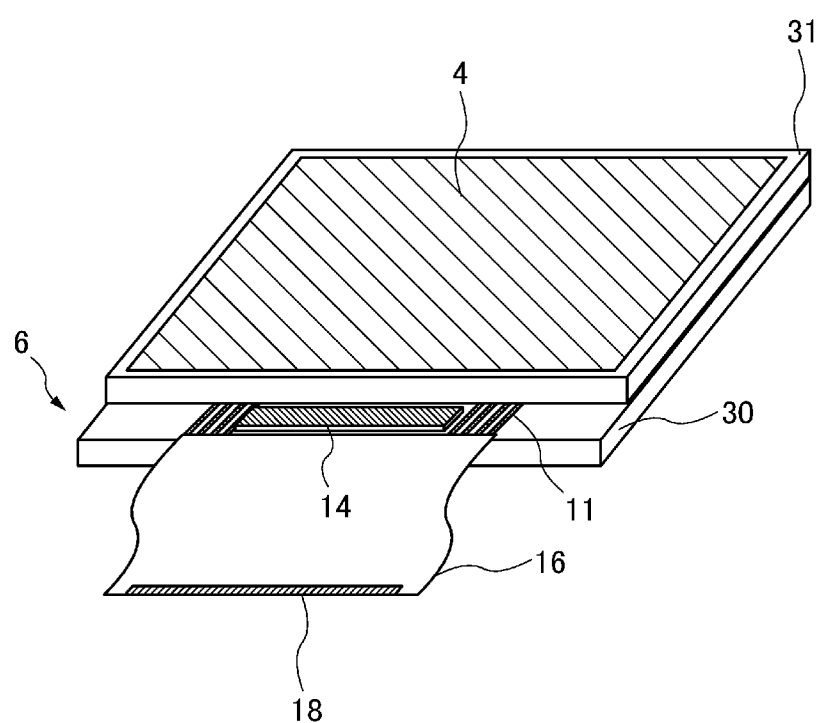
FIG. 7 is an isometric view of a modularized panel of the display device in embodiment 1 according to the present invention.

FIG. 7 is an isometric view of a modularized panel of the display device in embodiment 1 according to the present invention. The modularized panel shown in FIG. 7 is obtained by bonding the panel shown in FIG. 3 and the counter substrate 31 with the dam members and then attaching the driver IC 14, an FPC (Flexible Printed Circuit) 16 and the like. FIG. 8A is a cross-sectional view of the modularized panel. Although not shown, a transistor layer and a light-emitting layer are provided on the substrate 30 shown in FIG. 8A. Referring to FIG. 7, the counter substrate 31 is bonded with the substrate 30 such that the substrate 30 is exposed in the terminal area 6 in order to allow the driver IC 14 and the FPC 16 to be attached thereto. The external terminal lines 11 are located below the dam member 54 in the peripheral area 5-1 and extend to the terminal area 6, and are connected to the driver IC 14 and the FPC 16 in the terminal area 6. The driver IC 14 and the FPC 16 are pressure-bonded to the external terminal pads 12 with an anisometric conductive film or the like. The FPC 16 includes a terminal area 18 connectable to a controller circuit for controlling the driving circuit or the driving inspection circuit. In FIG. 8A, the testing pads 25 located in the peripheral area 5-2 of the panel are covered with the dam member 54.

Figure 8B:
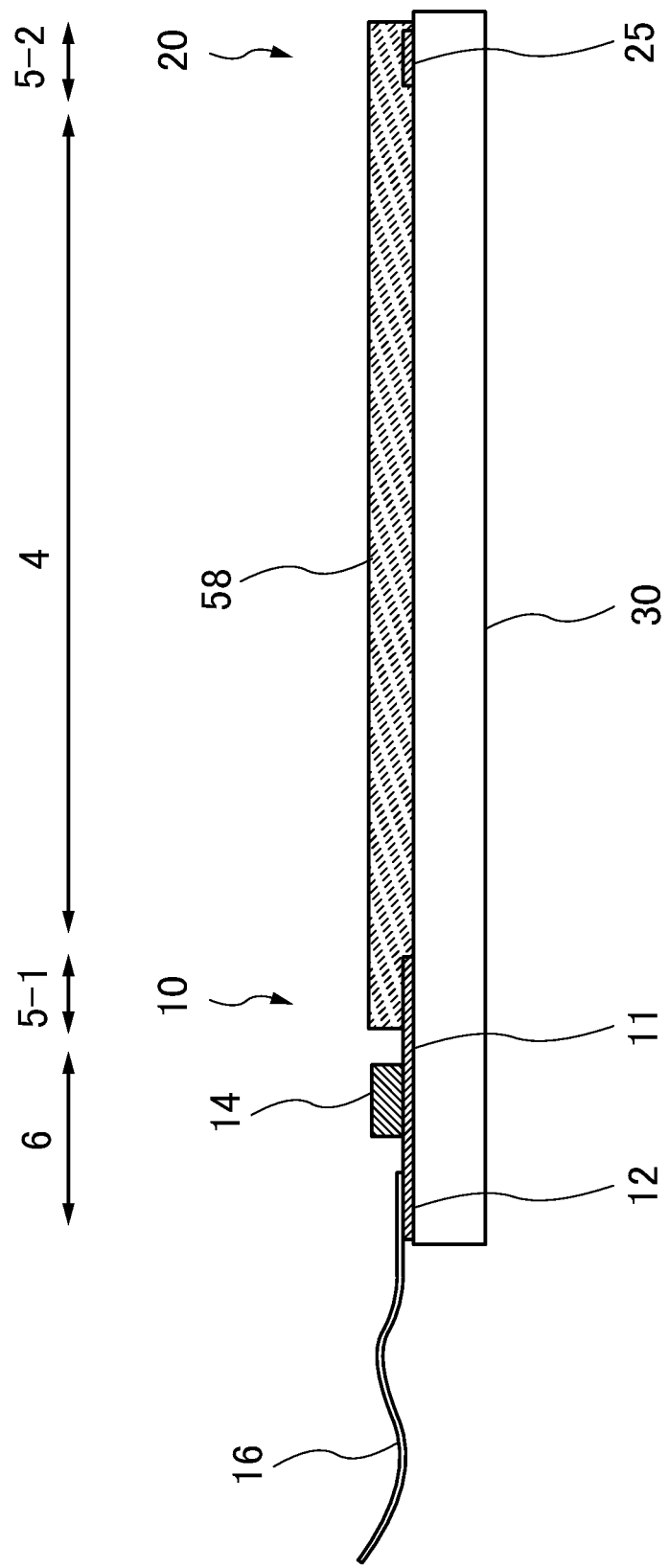
FIG. 8B is a cross-sectional view of a modularized panel of a display device in a modification of embodiment 1 according to the present invention.

In the structure shown in FIG. 8A, the light-emitting layer is sealed by use of the counter substrate 31, the dam members 54 and the filler 55. The present invention is not limited to having such a structure. As shown in FIG. 8B, the light-emitting layer may be sealed only by use of a sealing member 58. Although not shown, a transistor layer and a light-emitting layer are provided on the substrate 30 shown in FIG. 8B. With the structure shown in FIG. 8B, the sealing member 58 may be formed to cover the testing pads 25.

As described above, the external terminal lines 11 (first line layer 35 and second line layer 42) located below the dam member 54 in the peripheral area 5-1 shown in FIG. 3 and FIG. 4 and the testing pads 25 (first line layer 36 and second line layer 43) located below the dam member 54 in the peripheral area 5-2, shown in FIG. 3 and FIG. 4, of a panel adjacent to the panel including the external terminal lines 11 increase the size of the contact area of the protective film 53 and the dam members 54 and thus improve the adhesiveness between the protective film 53 and the dam members 54. The external terminal lines 11 and the testing pads 25 also keep the same the distance between the light-emitting layer located on the substrate 30 and the counter substrate 31, and thus suppress non-uniformity of interference.

Figure 9:
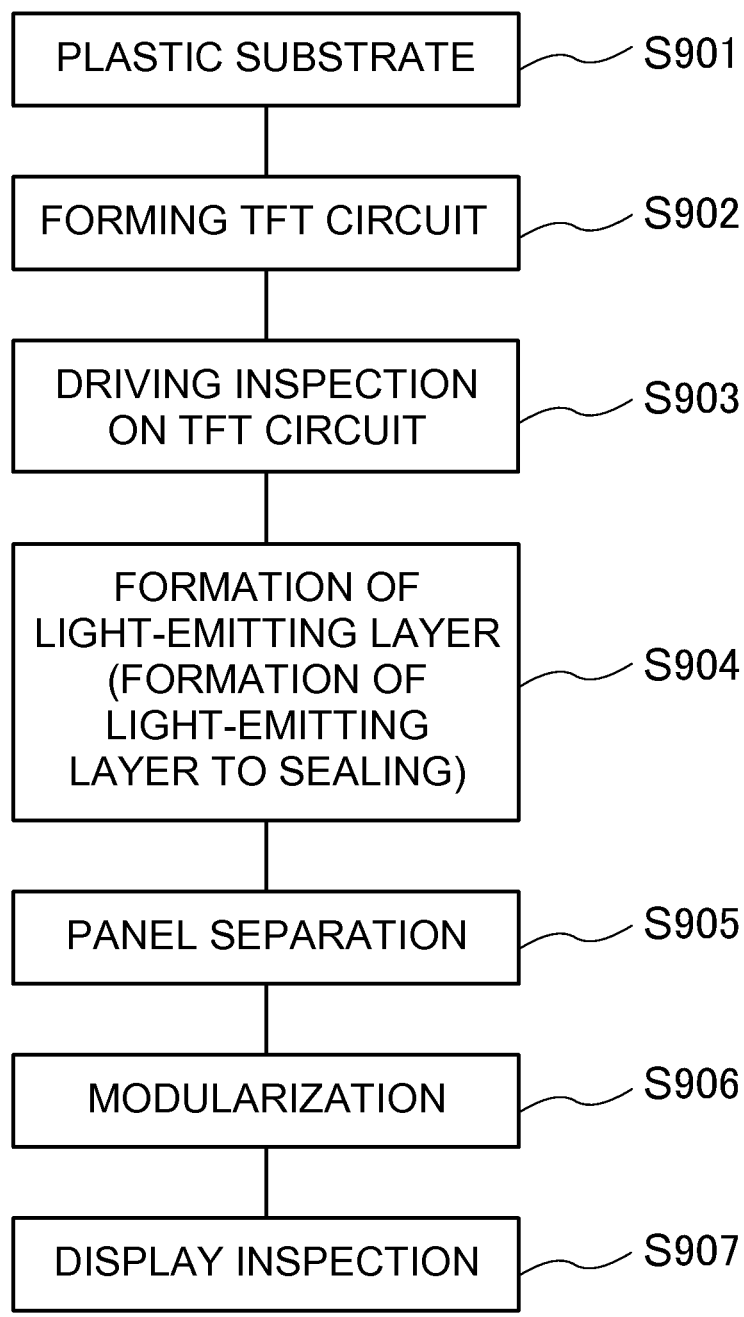
FIG. 9 shows a process flow of a manufacturing method of the display device in embodiment 1 according to the present invention.

Now, with reference to FIG. 9 through FIG. 16, a manufacturing method of the display device in embodiment 1 according to the present invention will be described. FIG. 9 shows a process flow of the manufacturing method of the display device in embodiment 1 according to the present invention. The process flow shown in FIG. 9 is of a flexible display device using a plastic substrate. FIG. 10 through FIG. 16 are cross-sectional views of the display area 4 and the peripheral areas 5-1 and 5-2 of the flexible display device in each of steps in the process flow shown in FIG. 9. Hereinafter, with reference to FIG. 9 and FIG. 10 through FIG. 16, the manufacturing method of the display device in embodiment 1 according to the present invention will be described.

Figure 10:
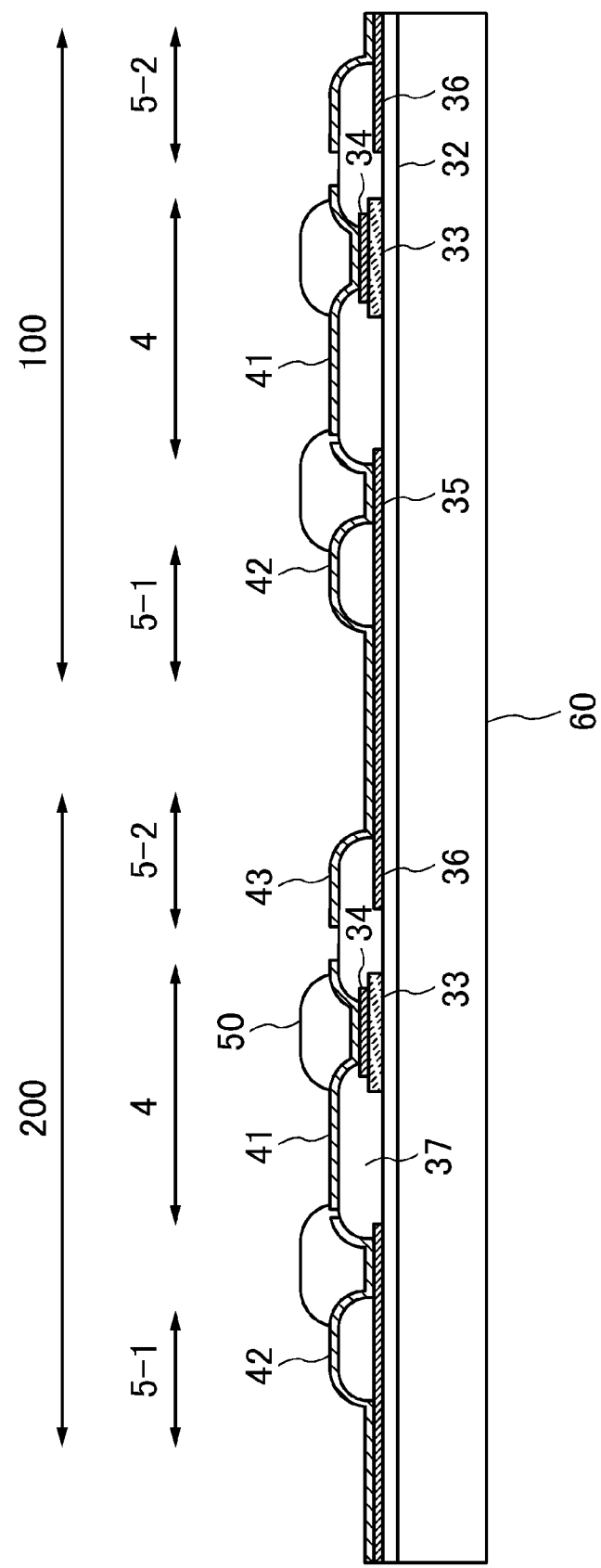
FIG. 10 is a cross-sectional view showing a step of the manufacturing method of the display device in embodiment 1 according to the present invention.

First, a plastic substrate 60 is prepared (S901). Then, the transistor layer 33, the transistor line layer 34, and the first line layers 35 and 36 are formed on the plastic substrate 60 with the underlining layer 32 being provided therebetween. Pixels are formed in the display area 4 of the panel, and a transistor circuit (TFT circuit) is formed in the peripheral area of the panel, namely, in the area in the vicinity of the display area 4 (S902). FIG. 10 is a cross-sectional view of a step of the manufacturing method of the display device in embodiment 1 according to the present invention. FIG. 10 shows a first panel region 100 and a second panel region 200 adjacent to each other. The first panel region 100 corresponds to the panel 7 shown in FIG. 2, and the second panel region 200 corresponds to the panel 8 shown in FIG. 2. The transistor formed in the transistor layer 33 may be a general transistor. For example, a bottom-gate transistor or top-gate transistor may be formed in the transistor layer 33. Unless specified, the following description with reference to FIG. 10 through FIG. 16 will be made regarding either one of the panel 100 and the panel 200.

After the transistor circuit is formed, the interlayer insulating layer 37 is formed. On the interlayer insulating layer 37, the pixel electrode 41 and the second line layers 42 and 43 electrically connected to corresponding line layers in the opening of the interlayer insulating layer 37 are formed. The second line layer 42 is used to form the external terminal lines 11 in the peripheral area 5-1, and the second line layer 43 is used to form the testing lines 21 and the testing pads 22 in the peripheral area 5-2. On the pixel electrode 41 and the second line layers 42 and 43, the demarcation layer 50 for demarcating the pixels in the display area 4 is formed. The first line layer 35 and the second line layer 42 located in the peripheral area 5-1 of the first panel region 100 extend to the second panel region 200 and are respectively connected to first line layer 36 and the second line layer 43 located in the peripheral area 5-2 of the second panel region 200.

Figure 11:
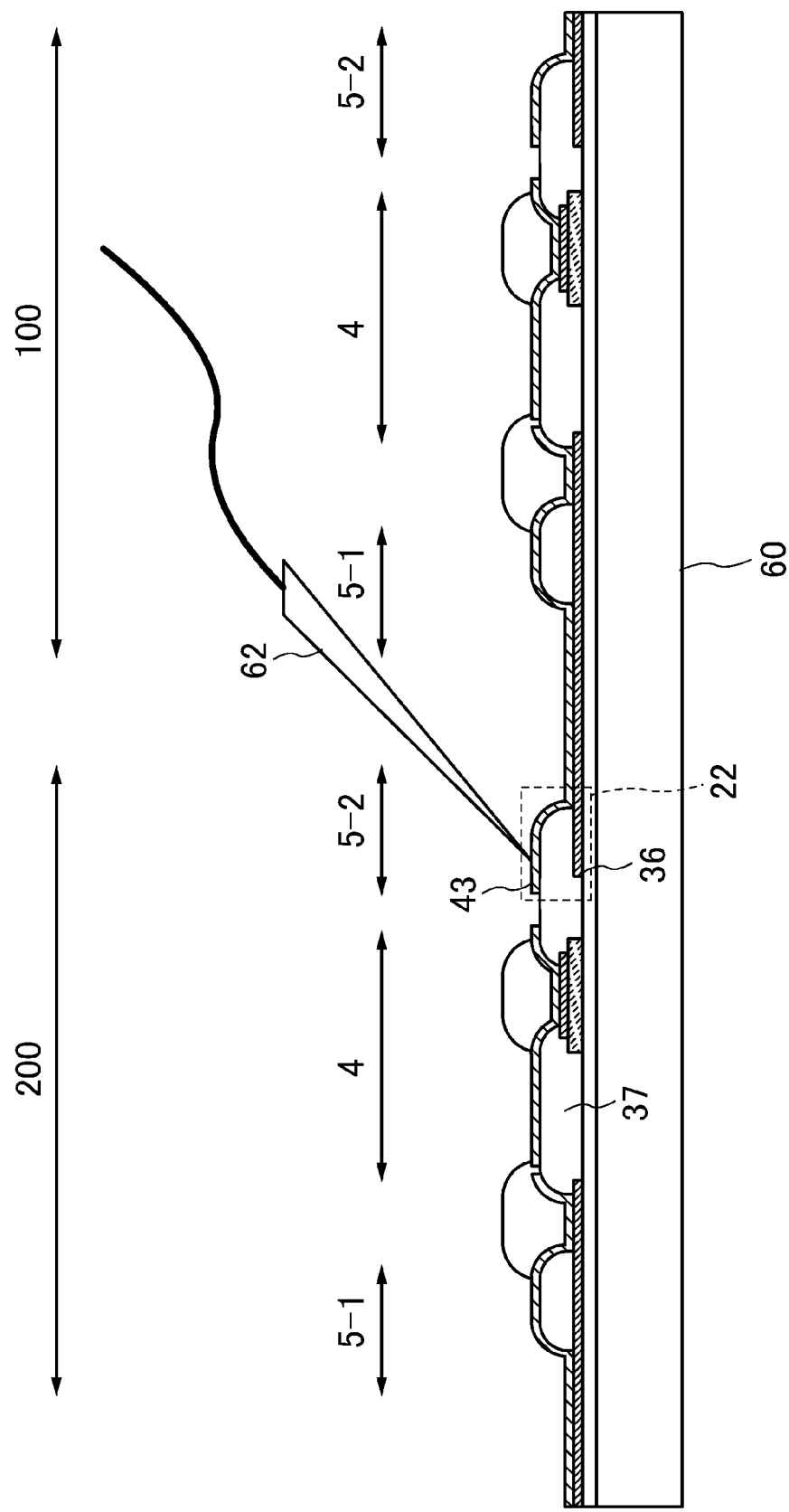
FIG. 11 is a cross-sectional view showing a driving inspection step on a transistor circuit in the manufacturing method of the display device in embodiment 1 according to the present invention.

Next, a signal for causing the transistor circuit to operate is input to the testing pads 22 to perform a driving inspection (S903). The driving inspection may be performed on a driving circuit actually operating or on a test circuit such as a TEG (Test Element Group). The driving inspection circuit is a known circuit which may be built in the transistor circuit or the drives IC 14. FIG. 11 is a cross-sectional view showing a driving inspection step of performing the driving inspection on the transistor circuit in the manufacturing method of the display device in embodiment 1 according to the present invention. The driving inspection on the transistor circuit in the first panel region 100 is performed by probing the testing pads 22 located in the peripheral area 5-2 of the second panel region 200 by use of a probe 62. In FIG. 11, the testing pads 22 include the first line layer 36 and the second line layer 43 that are stacked while having the interlayer insulating layer 37 therebetween. The present invention is not limited to having such a structure. The testing pads 22 may include the first line layer 36 and the second line layer 43 directly stacked on each other without the interlayer insulating layer 37. Alternatively, the testing pads 22 may include either one of the first line layer 36 and the second line layer 43. A result of the driving inspection can be reflected on a determination on whether or not to perform a modularization step later.

The driving inspection on the transistor circuit (S903), which is performed in order to check whether or not the driving circuit of each panel normally operates, is performed by inputting a signal that causes the transistor circuit to operate to the testing pads 22. A panel in which the transistor circuit is found to be abnormal by the driving inspection is not modularized. Only panels operating normally are modularized. In this sense, the driving inspection may act as a so-called screening test.

Figure 12:
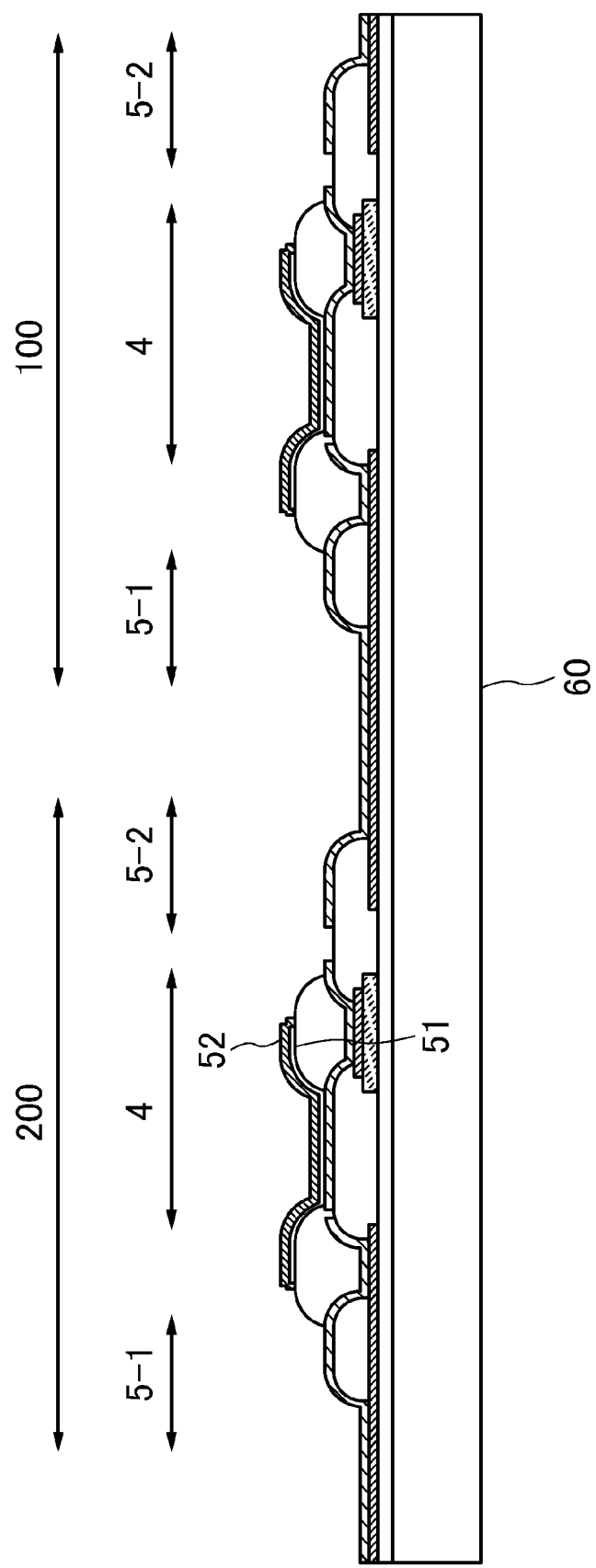
FIG. 12 is a cross-sectional view showing a light-emitting layer formation step in the manufacturing method of the display device in embodiment 1 according to the present invention.

Next, the light-emitting layer 51 and the common electrode 52 are formed (S904). FIG. 12 is a cross-sectional view showing a light-emitting layer formation step in the manufacturing method of the display device in embodiment 1 according to the present invention. In FIG. 12, the light-emitting layer 51 and the common electrode 52 are formed only in the display area 4 by use of a metal mask. The present invention is not limited to having such a structure. For example, the light-emitting layer 51 and the common electrode 52 may be formed over the entire surface of the substrate 60.

Figure 13:
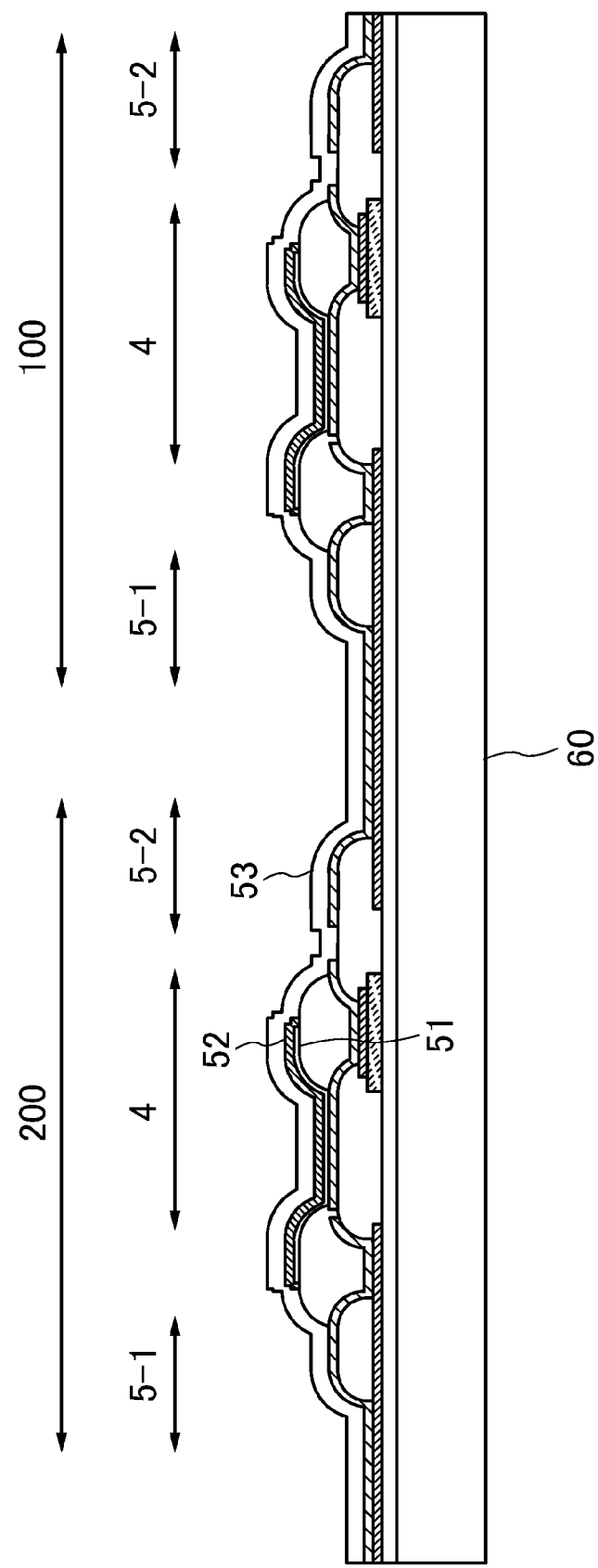
FIG. 13 is a cross-sectional view showing a protective film formation step in the manufacturing method of the display device in embodiment 1 according to the present invention.

Next, as shown in FIG. 13, the protective film 53 is formed on the light-emitting layer 51 and the common electrode 52 (S904). FIG. 13 is a cross-sectional view showing a protective film formation step in the manufacturing method of the display device in embodiment 1 according to the present invention. The protective film 53 is formed over the entire surface of the substrate 60, and may be formed of a material having a high blocking capability against moisture and impurities. The protective film 53 may be formed of, for example, a silicon nitride film, a silicon oxide film, or a stack of a silicon nitride film and a silicon oxide film. There may be cases where an area having a low film density is formed at a stepped portion below the protective film 53. In addition, a surface portion of the layer structure below the protective film 53 may have large concaved and convexed portions due to probing performed in the above-described driving inspection on the transistor circuit. Such an area having a low film density easily allows entrance of moisture and impurities, which fluctuates transistor characteristics or deteriorates the light-emitting layer 51. In order to avoid such a situation, the protective film 53 is formed of an organic material such as silicon nitride or silicon oxide so as to sufficiently cover the area having a low film density.

Figure 14:
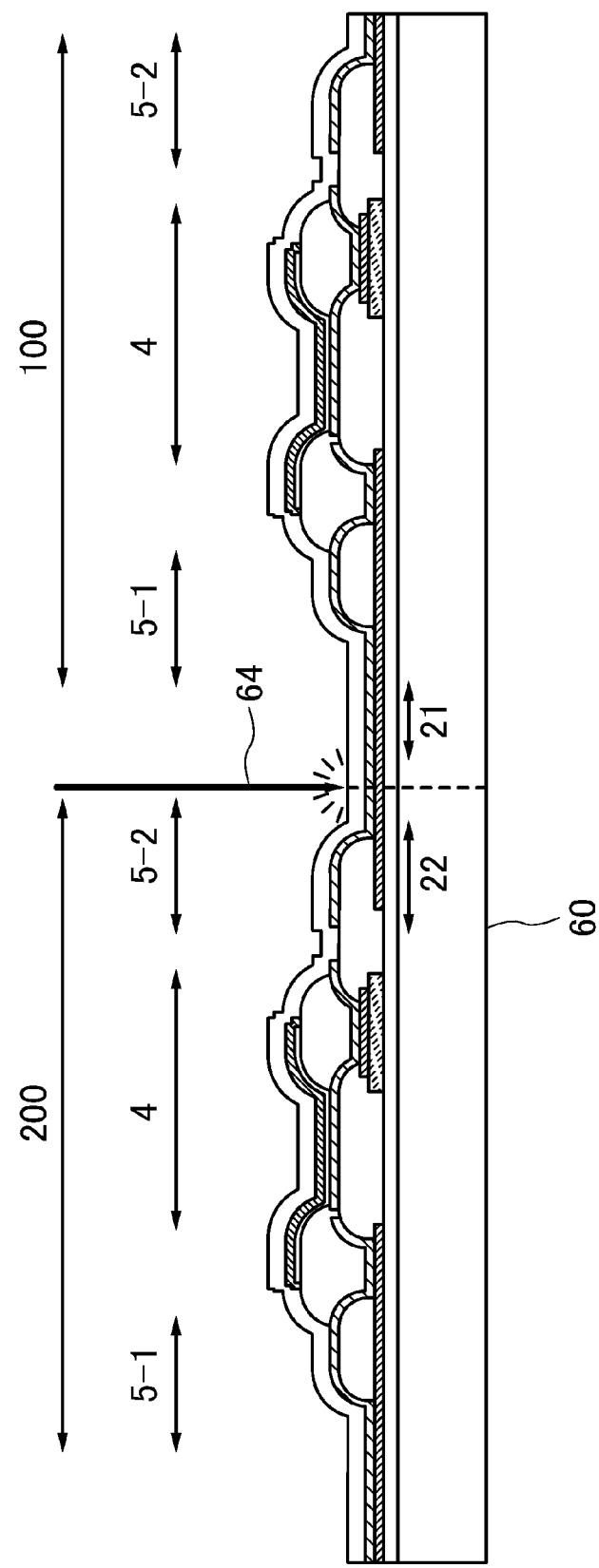
FIG. 14 is a cross-sectional view showing a panel separation step in the manufacturing method of the display device in embodiment 1 according to the present invention.
Figure 15:
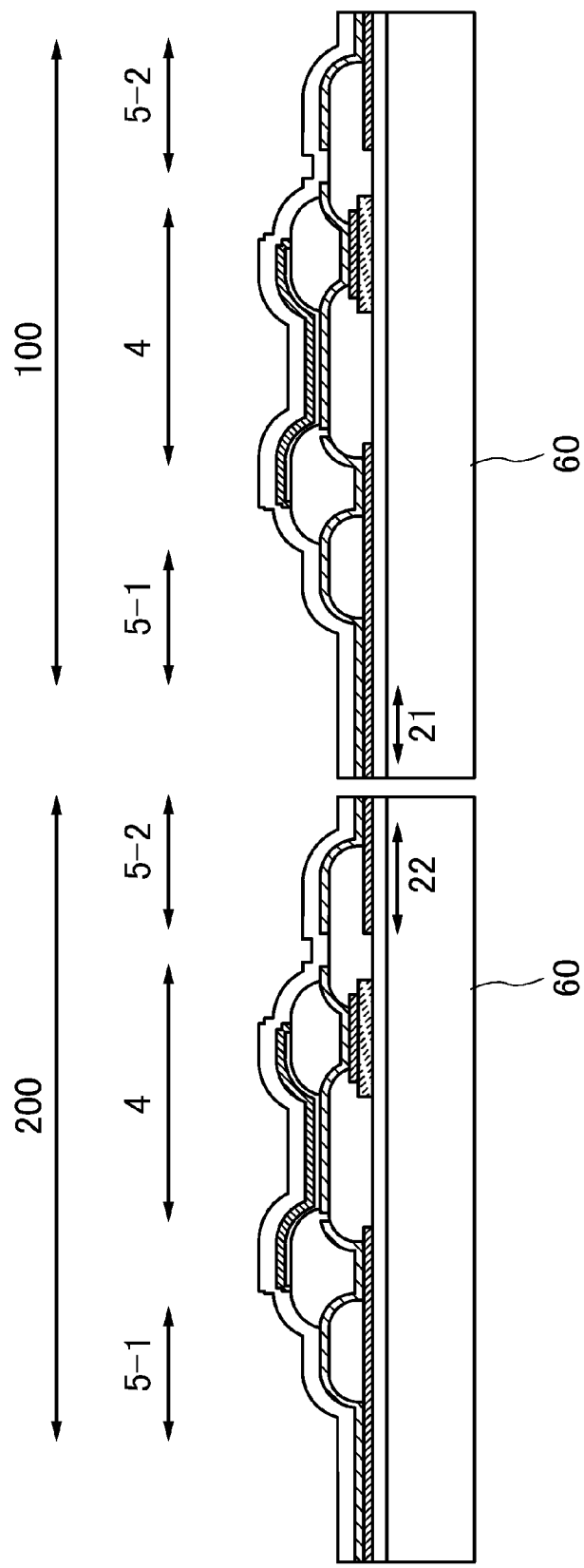
FIG. 15 is a cross-sectional view showing a panel separation step in the manufacturing method of the display device in embodiment 1 according to the present invention.

Next, as shown in FIG. 14, the substrate 60 is divided in order to separate the first panel region 100 and the second panel region 200 from each other (S905). FIG. 14 is a cross-sectional view showing a panel separation step in the manufacturing method of the display device in embodiment 1 according to the present invention. As shown in FIG. 2 and FIG. 3, the substrate 60 is divided along a line between the external terminal pads 12 located in the terminal area 6 of the first panel region 100 and the testing pads 22 (or 25) located in the peripheral area 5-2 of the second panel region 200. In FIG. 14, the testing lines 21 is divided at a position between the external terminal pads 12 and the testing pads 22. Alternatively, the testing pads 22 may be divided. As shown in FIG. 15, the testing lines 21 and the substrate 60 are divided, and as a result, the external terminal pads 12 and the testing pads 22 are separated from each other. Namely, the first panel region 100 and the second panel region 200 are separated from each other. FIG. 14 shows that the substrate 60 is divided by scribing by use of a laser 64 as an example.

Figure 16:
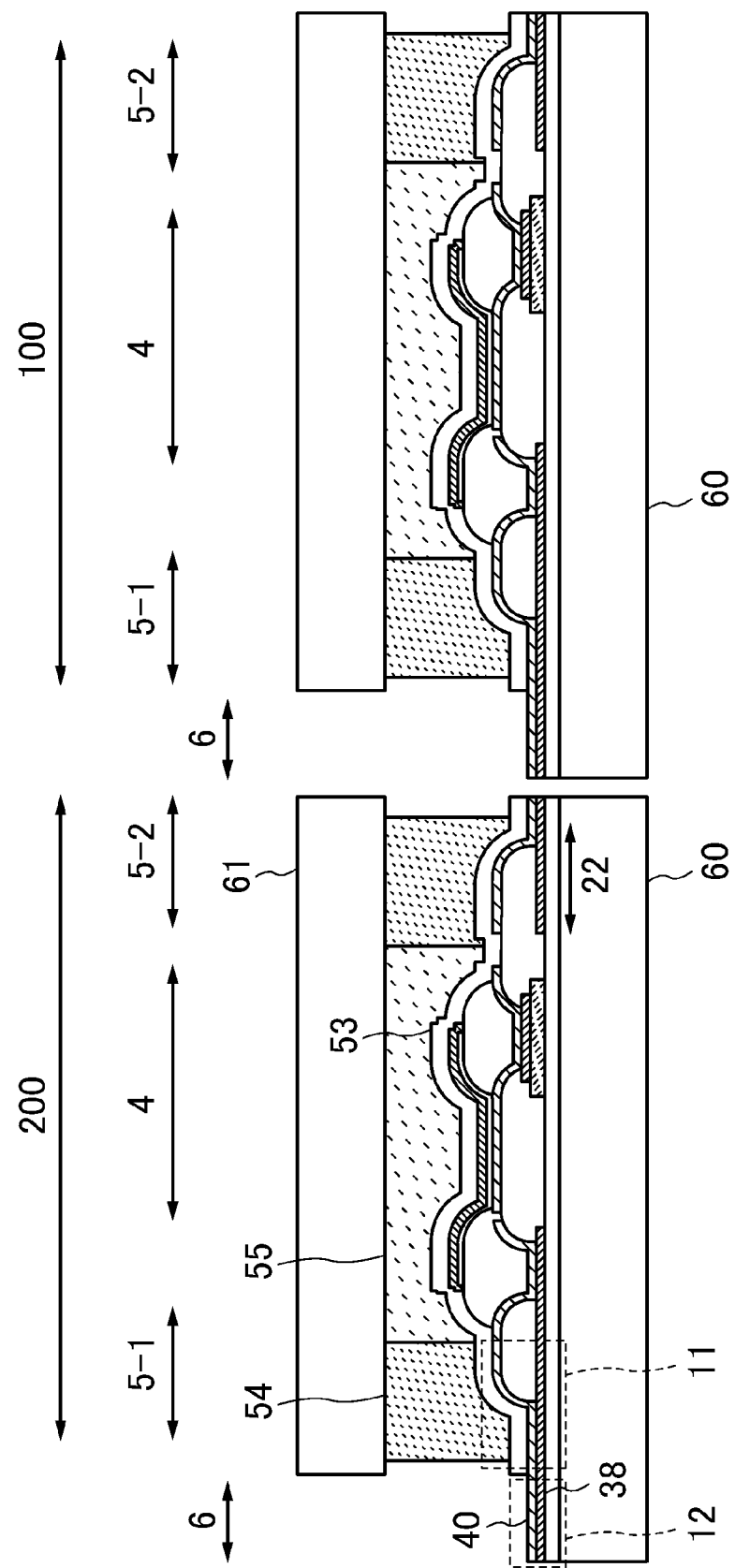
FIG. 16 is a cross-sectional view showing a modularization step in the manufacturing method of the display device in embodiment 1 according to the present invention.

Next, as shown in FIG. 16, the separated panels are each bonded with a counter substrate 61 with the dam members 54 (S906). FIG. 16 is a cross-sectional view showing the modularization step in the manufacturing method of the display device in embodiment 1 according to the present invention. A space enclosed by the substrate 60, the counter substrate 61 and the dam members 54 is filled with the filler 55. As shown in FIG. 2 and FIG. 6, the testing pads 22 may be covered with the dam member 54. In order to allow the driver IC 14 and the FPC 16 to be mounted, the external terminal pads 12 formed of a stack of the first line layer 38 and the second line layer 40 are exposed in the terminal area 6. The counter substrate 61 is bonded with the substrate 60 so as to expose the terminal area 6. The protective layer 53 is etched away in the terminal area 6 by use of the counter substrate 61 as a mask to expose the external terminal pads 12. Next, the driver IC 14 and the FPC 16 are mounted on the external terminal pads 12 in the terminal area 6. As a result, the modularized panel shown in FIG. 7 is produced (S906). Then, the modularized panel is subjected to display inspection (S907).

The display inspection on the panel is performed by putting a probe or the like to the external terminal pads 12 and inputting a test signal from an external device. For the display inspection, an area exclusive for the test such as a TEG or the like may be provided. For example, the display inspection may be performed on a circuit or a light-emitting layer exclusive for the test. Alternatively, various circuits and the light-emitting layer that are to be actually used in the display device may be subjected to the display inspection. A circuit for the driving inspection may be a known circuit built in the transistor circuit or the driver IC 14. The external terminal pads 12 are used for the display inspection on the panel and also are used for displaying an image in the display device.

In the driving inspection step of performing the driving inspection on the transistor circuit (S903), if the layer below a testing pad is formed of a material easily deformable by an external pressure, the testing pad and an area in the vicinity thereof are deformed by probing. In this embodiment also, there is a possibility that the testing pads 22 and the area in the vicinity thereof are deformed by probing. However, the testing pads 22 are located in a second panel region adjacent to the panel that is subjected to the driving inspection. Therefore, even though the testing pads 22 and the area in the vicinity thereof are deformed, such deformation does not influence the other external terminal pads, lines or the like.

As described above, pads of lines electrically connected to a driving inspection circuit of a first panel region are located in a peripheral area of a second panel region adjacent to the first panel region. This structure enlarges a usable space of a terminal area along the peripheral area of the first panel region, which raises the degree of freedom of layout in the peripheral area of the first panel region. In addition, even in the case where a flexible member is provided below the testing pads as in a flexible circuit board, the pads and an area in the vicinity thereof are suppressed from being deformed by probing, and influence of the deformation on the other external terminal pads, lines or the like is suppressed. This decreases the rate of defective devices found in the driving inspection step. This also makes it unnecessary to use a highly precise positional alignment mechanism for probing performed for testing. Since the time required for the alignment is shortened, the productivity is advantageously raised. Since the area size of the terminal area occupied by the pads is decreased, the size of the panels is reduced.

Other functions and effects provided by the forms described in this embodiment that are apparent from the description in this specification or readily conceivable by a person of ordinary skill in the art are interpreted as being duly provided by the present invention.

<Embodiment 2>

Figure 17:
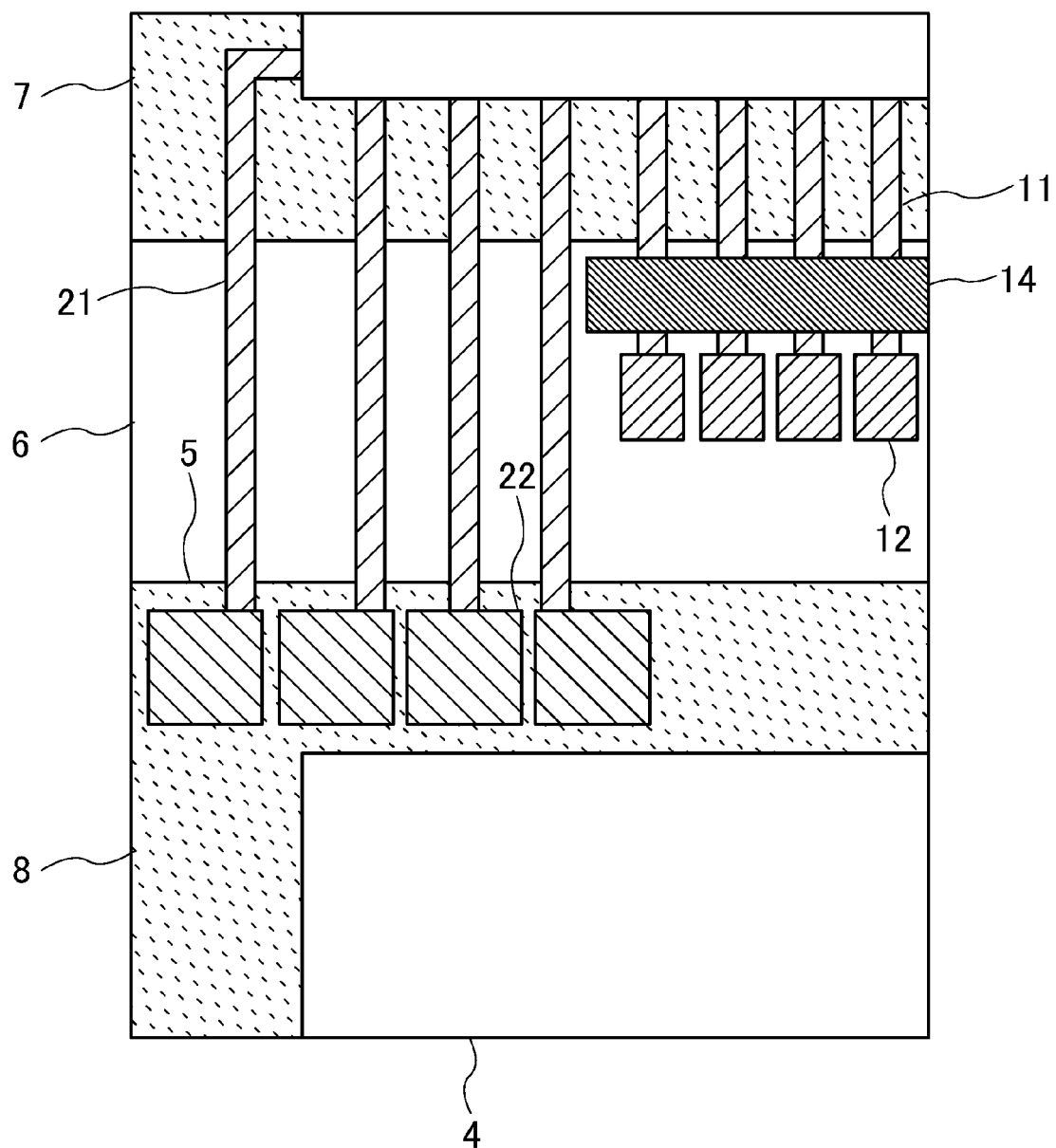
FIG. 17 is an enlarged view of an area between adjacent panels of display devices in embodiment 2 according to the present invention.
Figure 18:
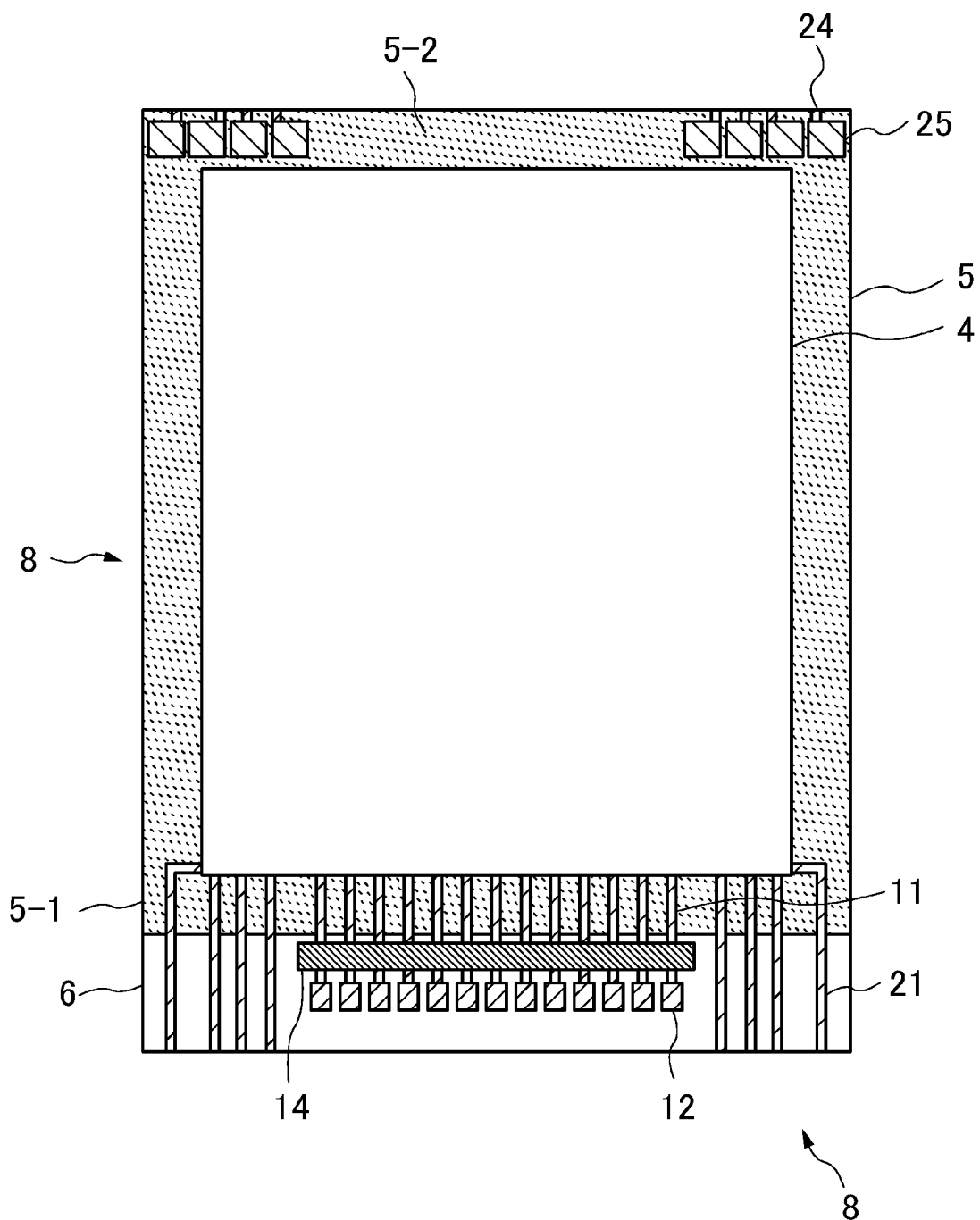
FIG. 18 is a plan view of one individual panel of the display device obtained by dividing a display device formation substrate in embodiment 2 according to the present invention.
Figure 19:
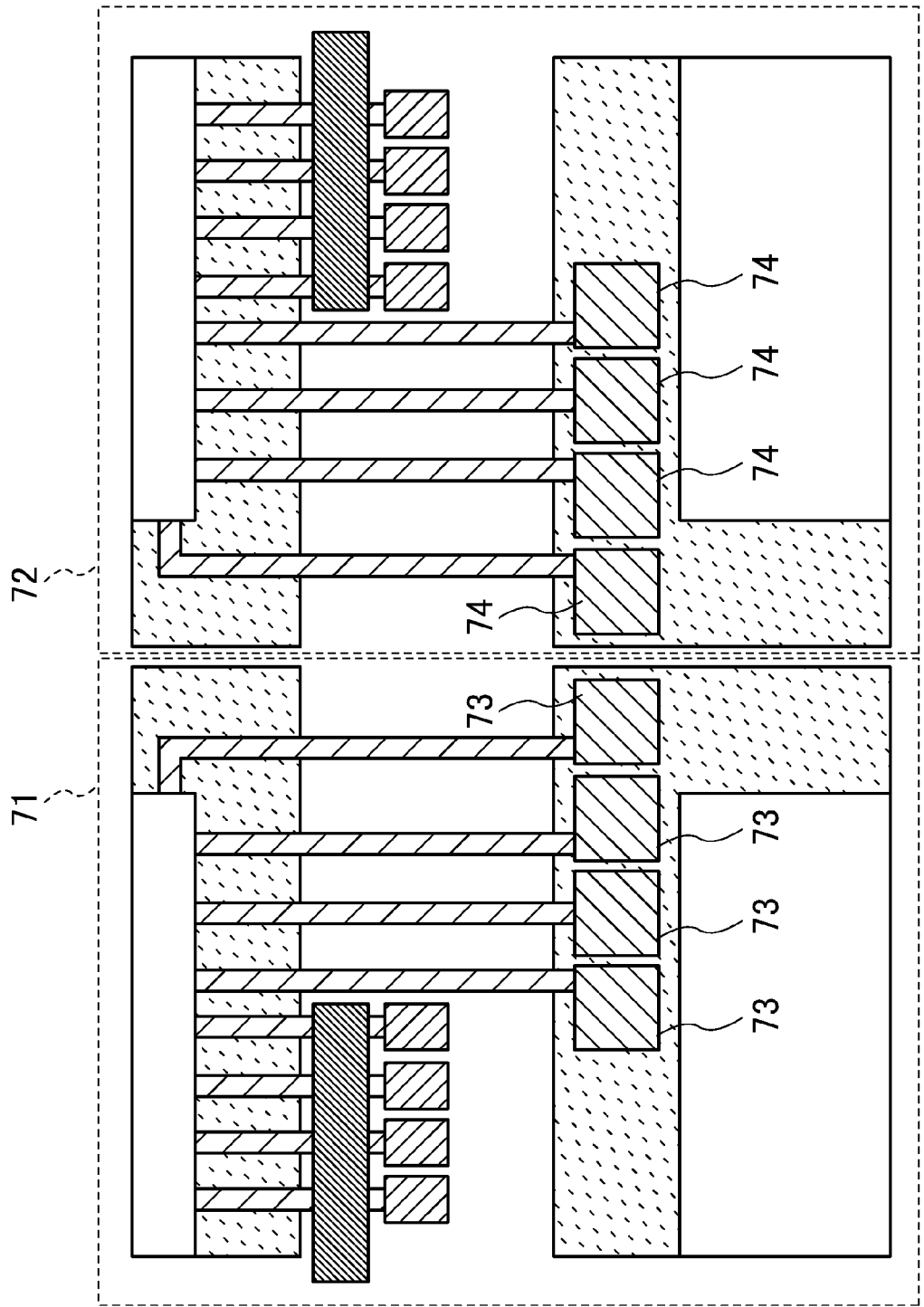
FIG. 19 is an enlarged view of an area between two panels of the display devices adjacent to each other in a horizontal direction in embodiment 2 according to the present invention.

With reference to FIG. 17 through FIG. 19, a structure of a display device in embodiment 2 according to the present invention will be described. FIG. 17 is an enlarged view of an area between adjacent panels of the display devices in embodiment 2 according to the present invention. More specifically, the enlargement view shown in FIG. 17 corresponds to an enlargement view of the area 9 between the panel 7 and the panel 8 shown in FIG. 1.

As shown in FIG. 17, in the terminal area 6 of the panel 7, the testing lines 21 are located outer to an area in which the external terminal lines 11 and the external terminal pads 12 are located. The external terminal lines 11 are electrically connected to a transistor circuit for driving the pixels in the panel 7. The testing lines 21 are electrically connected to a transistor circuit for driving inspection and extend to the panel 8. FIG. 18 is a plan view of an individual panel (herein, panel 8) of the display device in embodiment 2 according to the present invention that is obtained as a result of the display device formation substrate being divided as described above in embodiment 1. As shown in FIG. 18, the testing lines 21 are located on both sides of an area in which the plurality of external terminal lines 11 are located. The external terminal lines 11 are connected to the external terminal pads 12 located in the terminal area 6 of the panel 8. A part of the external terminal lines 11 may be connected to the driver IC 14.

The testing lines 24 of the panel 7 are connected to the testing pads 25 located in the peripheral area 5-2 of the panel 8. An area in which the testing pads 25 are located is included in a region on which a dam member, for holding a filler that is used to seal a light-emitting layer, is to be located in a later step. Namely, the testing pads 25 of the panel 7 are to be covered with the dam member in the peripheral area 5-2 of the panel 8 in the later step. The dam member also acts as a sealing member for bonding the display device formation substrate including the transistors and a counter substrate to each other. In FIG. 17, the testing pads 22 are located to be completely covered with the dam member that is to be located in the peripheral area 5 of the panel 8. Alternatively, a part of the testing pads 22 may be located in the terminal area 6 of the panel 7.

FIG. 19 is an enlarged view of an area 70 between panels 71 and 72 (see FIG. 1) of the display devices in embodiment 2 according to the present invention. The panel 71 and the panel 72 are adjacent to each other in the horizontal direction. Testing pads 73 of the panel 71 and testing pads 74 of the panel 72 are located adjacent to each other, so that the panel 71 and the panel 72 are subjected to a driving inspection at the same time by use of a probe guard, which is used to perform a driving inspection on a driving inspection circuit. The structure shown in FIG. 19 in which the testing pads 73 and 74 of the panels 71 and 72 are located adjacent to each other shortens the time required for the driving inspection to half or less, which raises the productivity.

<Embodiment 3>

Figure 20:
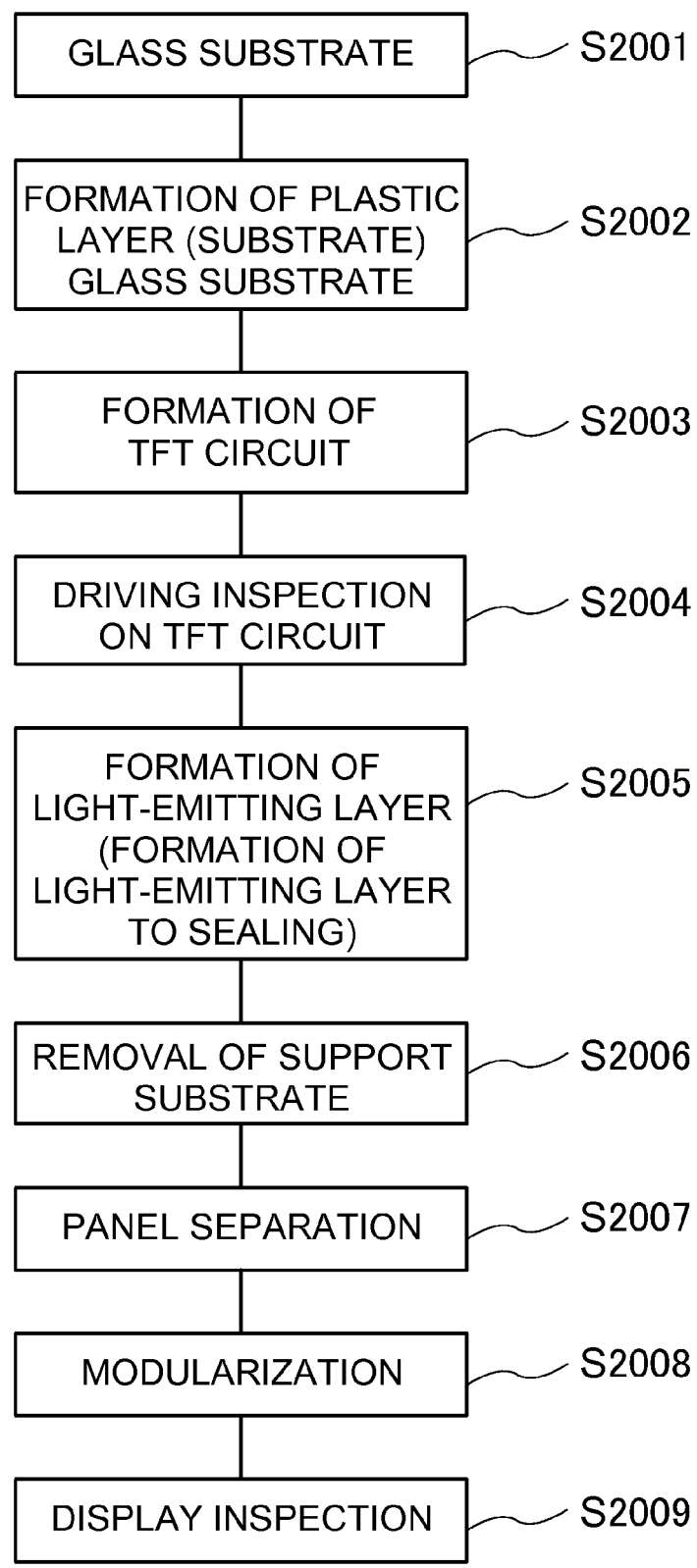
FIG. 20 shows a process flow of a manufacturing method of a display device in embodiment 3 according to the present invention.
Figure 21:
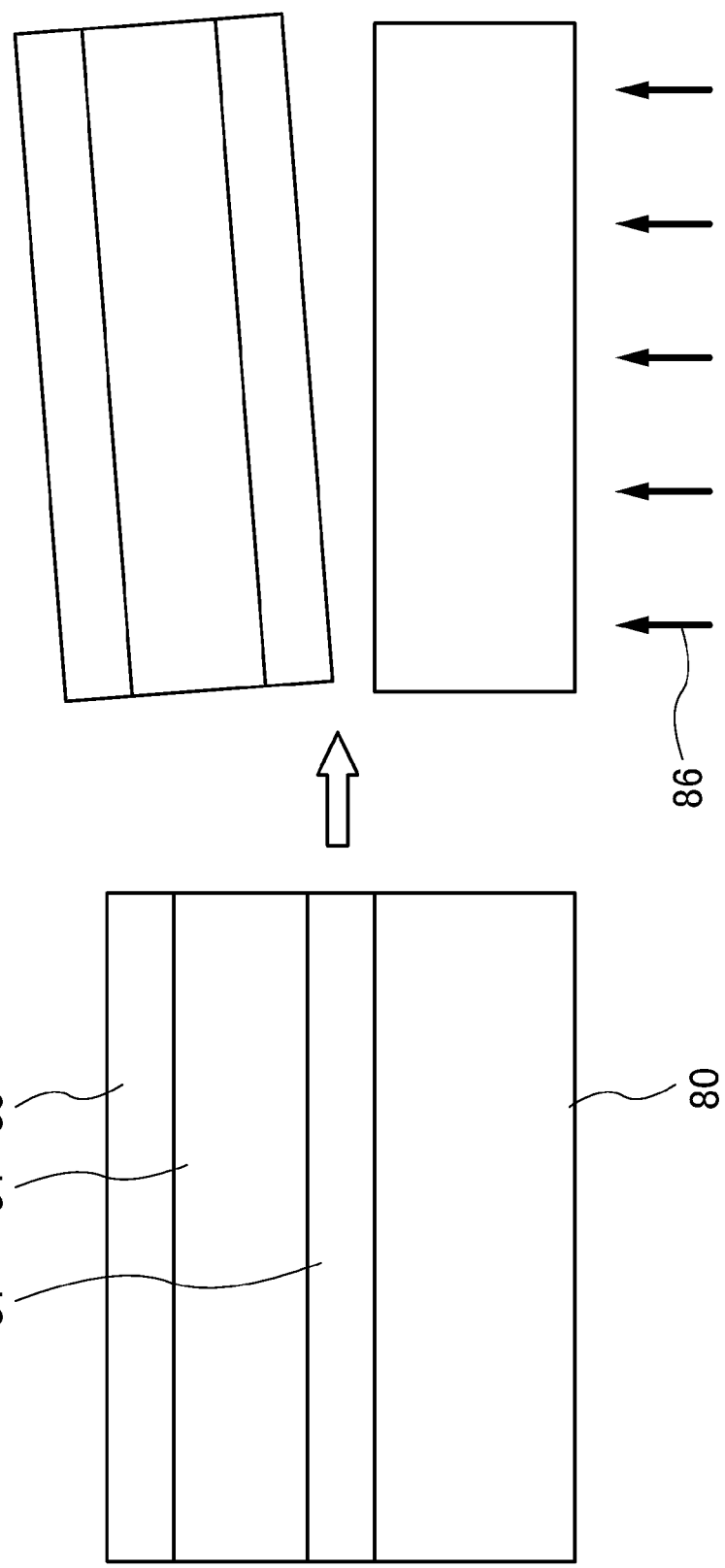
FIG. 21 shows a support substrate removal step in the manufacturing method of the display device in embodiment 3 according to the present invention.
Figure 22:
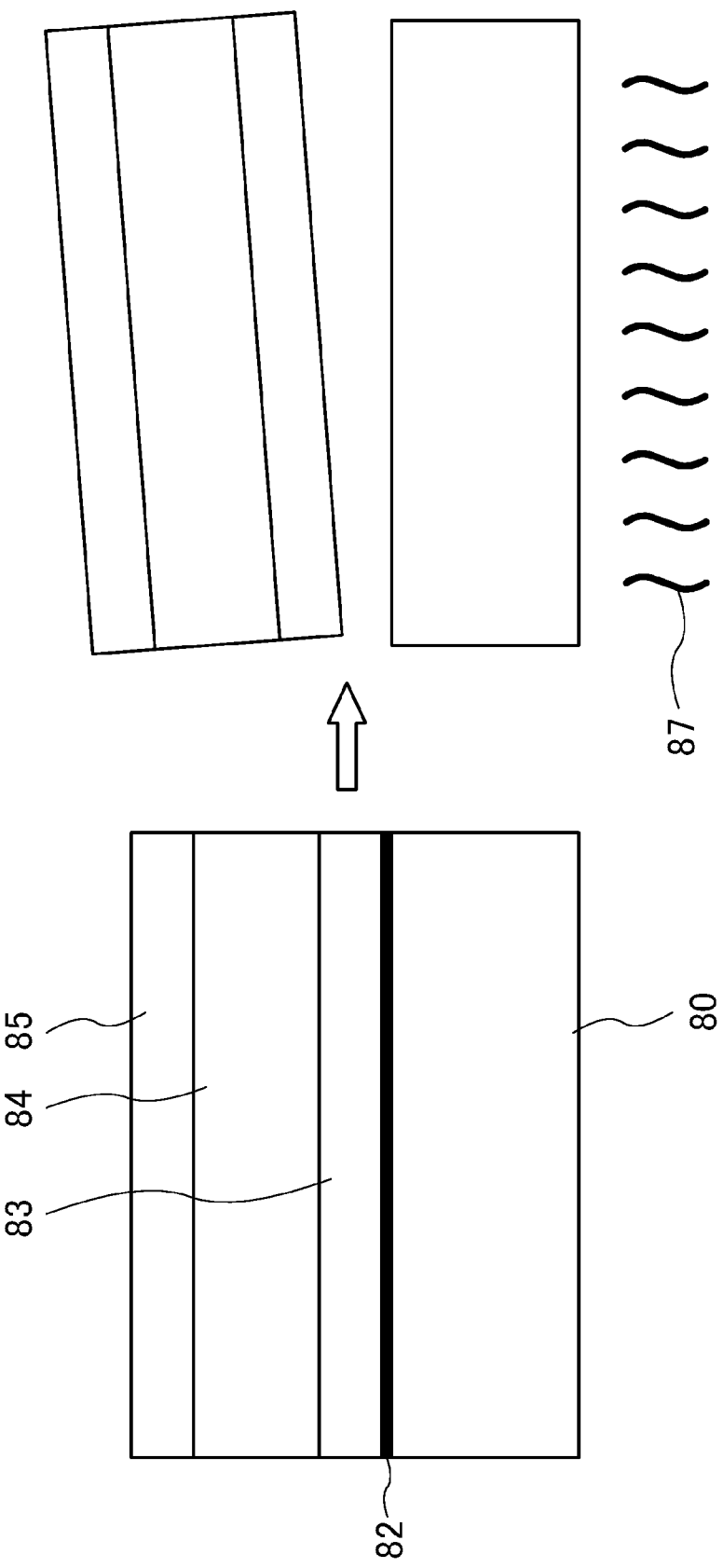
FIG. 22 shows a support substrate removal step in the manufacturing method of the display device in embodiment 3 according to the present invention.

With reference to FIG. 20 through FIG. 22, a manufacturing method of, and a structure of, a display device in embodiment 3 according to the present invention will be described. FIG. 20 shows a process flow of the manufacturing method of the display device in embodiment 3 according to the present invention. The process flow shown in FIG. 20 is of a flexible display device. In the method shown in FIG. 20, unlike in FIG. 9, a plastic layer is formed on a glass substrate, and after a transistor layer and a light-emitting layer are formed, the plastic layer is removed from the glass substrate. Namely, FIG. 20 shows an example of so-called transfer manufacturing method of a flexible display device. FIG. 21 and FIG. 22 each show a support substrate removal step in the manufacturing method of the display device in embodiment 3 according to the present invention.

The process flow shown in FIG. 20 will be described with reference to FIG. 21 and FIG. 22, especially regarding differences from the process flow shown in FIG. 9. As shown in FIG. 20, first, a glass substrate 80 is prepared as a support substrate (S2001). On the glass substrate 80, a plastic layer 81 or a plastic substrate 83 is formed (S2002). In the case where the plastic layer 81 is formed, an organic resin film formed of polyimide or the like is formed on the glass substrate 80 by an application method or the like. In the case where the plastic substrate 83 is formed, the plastic substrate 83 is bonded to the glass substrate with an adhesive resin 82. The steps after this, namely, a transistor circuit formation step (S2003), a transistor circuit driving inspection step (S2004), and a light-emitting layer formation step (S2005) are performed in substantially the same manner as described above with reference to FIG. 9.

Next, the plastic layer 81 or the plastic substrate 83 is removed from the glass substrate 80 (S2006). As a result of the removal step, a plastic substrate or layer having a transistor layer 84 and a light-emitting layer 85 formed thereon is provided. Hereinafter, the removal step will be described in detail with reference to FIG. 21 and FIG. 22.

FIG. 21 shows a process of forming the plastic layer 81 on the glass substrate 80 and then removing the plastic layer 81. First, an organic resin film formed of polyimide or the like is formed on the glass substrate 80 by an application method. Next, the transistor layer 84 and the light-emitting layer 85 are formed on the organic resin film in substantially the same manner as in S902 through S904 in FIG. 9. Then, a rear surface of the glass substrate 80 is irradiated with laser 86 to locally heat a surface of the plastic layer 81 on the glass substrate 80 side. Thus, the plastic layer 81 having the transistor layer 84 and the light-emitting layer 85 formed thereon is removed from the glass substrate 80.

FIG. 22 shows a process of bonding a plastic substrate 83 to the glass substrate 80 with an adhesive resin 82 and then removing the plastic substrate 83. First, the adhesive resin 82 is applied to the glass substrate 80, and the plastic substrate 83 is bonded thereto. Next, the transistor layer 84 and the light-emitting layer 85 are formed on the plastic substrate 83 in substantially the same manner as in S902 through S904 in FIG. 9. Then, the rear surface of the glass substrate 80 is irradiated with laser UV 87 to change the properties of the adhesive resin 82 such that the adhesive force of the adhesive resin 82 is lowered. Thus, the plastic substrate 83 having the transistor layer 84 and the light-emitting layer 85 formed thereon is removed from the glass substrate 80.

In the methods shown in FIG. 21 and FIG. 22, the plastic layer or the plastic substrate, which is flexible, is present below the transistor layer 84. Therefore, in the transistor circuit driving inspection step (S2004), the pads or the area in the vicinity thereof are deformed by probing. Namely, even for a display device produced by the method in which a plastic substrate is provided on, and then removed from, the support substrate, the structure shown in embodiment 1 of 2 is highly effective. More specifically, the structure in which the testing pads 22 electrically connected to the driving inspection circuit of a first panel region is provided in the peripheral area of a second panel region adjacent to the first panel region provides an effect of suppressing the influence of the deformation on the other external terminal pads, lines or the like.

<Embodiment 4>

Figure 23:
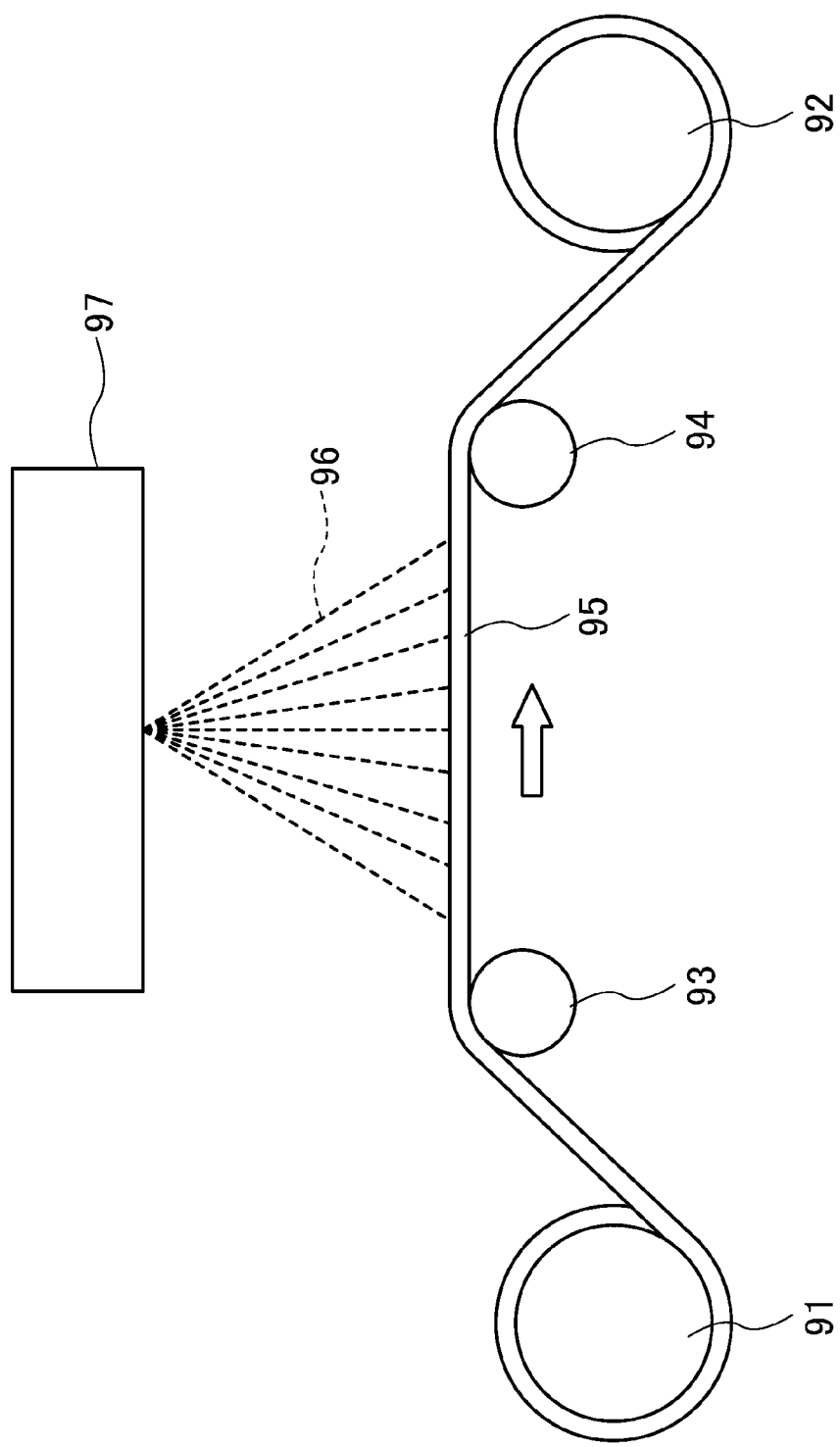
FIG. 23 shows a manufacturing method of a flexible circuit board in embodiment 4 according to the present invention.

With reference to FIG. 23, a manufacturing method of a flexible circuit board in embodiment 4 according to the present invention will be described. FIG. 23 shows the manufacturing method of the flexible circuit board in embodiment 4 according to the present invention. The flexible circuit board shown in FIG. 23 is produced by a roll-to-roll method as follows. A plastic film 95 wound around a first roll 91 is taken up by a second roll 92. A distance of the plastic film 95 from a source of a film-forming material in a film formation device 97 is adjusted by a first support roller 93 and a second support roller 94. While the plastic film 95 moves between the support rollers, a thin film material 96 is formed into a film.

For a panel formed on the plastic film by the roll-to-roll method as described above, the structure shown in embodiment 1 of 2 is highly effective. More specifically, the structure in which the testing pads 22 electrically connected to the driving inspection circuit of a first panel region is provided in the peripheral area of a second panel region adjacent to the first panel region provides an effect of suppressing the influence of the deformation on the other external terminal pads, lines or the like.

The present invention is not limited to any of the above-described embodiments, and the embodiments may be appropriately modified without departing from the gist of the present invention.

As described above, pads of lines electrically connected to a driving inspection circuit of a first panel region are located in a peripheral area of a second panel region adjacent to the first panel region. This structure enlarges a usable space of a terminal area along the peripheral area of the first panel region, which raises the degree of freedom of layout in the peripheral area of the first panel region. In addition, even in the case where a flexible member is provided below the testing pads as in a flexible circuit board, the pads and an area in the vicinity thereof are suppressed from being deformed by probing, and influence of the deformation on the other external terminal pads, lines or the like is suppressed. This makes it unnecessary to use a highly precise alignment mechanism for positional alignment for probing performed for testing. Since the time required for the alignment is shortened, the productivity is advantageously raised.

Since the area size of the terminal area occupied by the pads is decreased, the size of the panels is reduced.

What is claimed is:

1. A manufacturing method of a display device, comprising:
    forming pixels in a first display area provided in a first panel region of a first substrate and a second display area provided in a second panel region of the first substrate, wherein the first panel region is adjacent to the second panel region;
    forming a transistor circuit in a first peripheral area of the first panel region, the first peripheral area being located in the vicinity of the first display area;
    forming a first pad in the first peripheral area;
    forming a second pad in a second peripheral area of the second panel region, the second pad being electrically connected to the transistor circuit;
    performing a driving inspection on the transistor circuit by use of the second pad; and
    separating the first pad and the second pad from each other by separating the second panel region of the first substrate from the first panel region of the first substrate after the driving inspection.

2. The manufacturing method of a display device according to claim 1, further comprising forming a sealing member covering the second pad in the second panel region.

3. The manufacturing method of a display device according to claim 2, wherein:
    a plurality of the second pads are formed;
    the plurality of second pads are electrically connected to the transistor circuit via a plurality of second lines; and
    the first pad is formed between any two of the plurality of second lines.

4. The manufacturing method of a display device according to claim 2, wherein:
    a plurality of the first pads and a plurality of the second pads are formed;
    the plurality of second pads are electrically connected to the transistor circuit via a plurality of second lines; and
    the plurality of second lines are formed outer to the plurality of first pads.

5. The manufacturing method of a display device according to claim 1, wherein the driving inspection is performed by probing the second pad.

6. The manufacturing method of a display device according to claim 5, wherein the second pad is formed on the first substrate containing a resin.

7. The manufacturing method of a display device according to claim 1, further comprising:
    forming a first wire layer on the first substrate, the first wire layer connecting with the transistor circuit;
    forming a second wire layer of a plurality of stack wire, the second wire layer being on the first substrate and connecting the second pad to the transistor circuit;
    forming an interlayer film on the first wire layer and the second wire layer;
    forming a pixel electrode on the interlayer film, the pixel electrode electrically connecting with the first wire layer; and
    forming a third wire layer of the plurality of stack wire, the third wire layer being on the interlayer film.

* * * * *